(12) United States Patent
Brosseau et al.

(10) Patent No.: US 10,362,720 B2
(45) Date of Patent: Jul. 23, 2019

(54) ROTATIONAL REMOVAL OF ELECTRONIC CHIPS AND OTHER COMPONENTS FROM PRINTED WIRE BOARDS USING LIQUID HEAT MEDIA

(71) Applicant: Greene Lyon Group, Inc., Beverly, MA (US)

(72) Inventors: Andre Brosseau, Montreal (CA); Svitlana Moskovchenko, Montreal (CA)

(73) Assignee: Greene Lyon Group, Inc., Beverly, MA (US)

(*) Notice: Subject to any disclaimer, the term of this patent is extended or adjusted under 35 U.S.C. 154(b) by 0 days.

(21) Appl. No.: 15/501,481

(22) PCT Filed: Aug. 6, 2015

(86) PCT No.: PCT/US2015/043930
§ 371 (c)(1),
(2) Date: Feb. 3, 2017

(87) PCT Pub. No.: WO2016/022755
PCT Pub. Date: Feb. 11, 2016

(65) Prior Publication Data
US 2017/0223882 A1    Aug. 3, 2017

Related U.S. Application Data

(60) Provisional application No. 62/033,730, filed on Aug. 6, 2014.

(51) Int. Cl.
*B23K 31/02* (2006.01)
*H05K 13/04* (2006.01)
(Continued)

(52) U.S. Cl.
CPC ........... *H05K 13/0486* (2013.01); *B03B 5/04* (2013.01); *B03B 5/30* (2013.01); *B07C 5/342* (2013.01);
(Continued)

(58) Field of Classification Search
CPC ........ H05K 13/0486; B03B 5/30; B03B 5/04; B07C 5/342; B23K 1/0016; B23K 1/018; B23K 2201/42
(Continued)

(56) References Cited

U.S. PATENT DOCUMENTS 2,704,707 A   3/1955   Lemeshka
3,084,649 A   4/1963   Parstorfer
(Continued)

FOREIGN PATENT DOCUMENTS

CN    101623698 A    1/2010
EP    0 834 375 A1   4/1998
(Continued)

OTHER PUBLICATIONS

Translation of CN101623698A (no date available).*
(Continued)

*Primary Examiner* — Kiley S Stoner
(74) *Attorney, Agent, or Firm* — Wolf, Greenfield & Sacks, P.C.

(57) ABSTRACT

Systems and methods for the removal of electronic chips and other components from PWBs using liquid heat media are generally described. According to certain embodiments, PWBs comprising solder can be positioned within a rotatable housing. The rotatable housing can, in some embodiments, be at least partially immersed within a liquid heat medium. The liquid heat medium can be heated and/or maintained at a temperature sufficiently high to melt the solder. In some embodiments, the rotatable housing can be
(Continued)

rotated while it is at least partially immersed in the liquid heat medium. The rotational force can aid, according to some embodiments, in the removal of solder, electronic chips (including those in which an integrated circuit is positioned on a piece of semiconductor material, such as silicon), and/or other electronic components attached to one or more surfaces of the PWB.

17 Claims, 14 Drawing Sheets

(51) Int. Cl.
  *B23K 1/018* (2006.01)
  *B03B 5/04* (2006.01)
  *B03B 5/30* (2006.01)
  *B07C 5/342* (2006.01)
  *B23K 1/00* (2006.01)
  *B23K 101/42* (2006.01)
(52) U.S. Cl.
  CPC ............ *B23K 1/0016* (2013.01); *B23K 1/018* (2013.01); *B23K 2101/42* (2018.08)
(58) Field of Classification Search
  USPC .................. 228/119, 191, 264, 201, 202, 19
  See application file for complete search history.

(56) References Cited

U.S. PATENT DOCUMENTS

| | | |
|---|---|---|
| 3,210,182 A | 10/1965 | Funari |
| 3,393,998 A * | 7/1968 | Lambert ............... B23K 1/018 420/475 |
| 3,557,430 A | 1/1971 | Jones |
| 3,684,151 A | 8/1972 | Burman et al. |
| 3,731,866 A | 5/1973 | Mason et al. |
| 3,795,358 A | 3/1974 | Sarnacki et al. |
| 3,815,806 A | 6/1974 | Paxton |
| 3,834,605 A | 9/1974 | Coffin |
| 3,866,893 A * | 2/1975 | Hoberman ............ B23K 1/0002 266/120 |
| 3,882,596 A | 5/1975 | Kendziora et al. |
| 4,022,370 A | 5/1977 | Durney |
| 4,083,323 A | 4/1978 | Rote |
| 4,270,260 A | 6/1981 | Krueger |
| 4,277,518 A | 7/1981 | Schillke et al. |
| 4,321,031 A | 3/1982 | Woodgate |
| 4,334,646 A | 6/1982 | Campbell |
| 4,378,296 A | 3/1983 | Carlson et al. |
| 4,414,914 A | 11/1983 | Caratsch |
| 4,446,358 A | 5/1984 | Comerford et al. |
| 4,506,820 A | 3/1985 | Brucker |
| 4,552,300 A | 11/1985 | Zovko et al. |
| 4,561,584 A | 12/1985 | Hug |
| 4,619,841 A | 10/1986 | Schwerin |
| 4,632,291 A | 12/1986 | Rahn et al. |
| 4,659,002 A | 4/1987 | Wallgren et al. |
| 4,725,716 A | 2/1988 | Entwistle et al. |
| 4,769,083 A | 9/1988 | Tiritilli |
| 4,782,991 A | 11/1988 | Breu |
| 4,832,249 A | 5/1989 | Ehler |
| 4,876,437 A | 10/1989 | Kondo |
| 4,915,624 A | 4/1990 | Mittelstadt |
| 4,931,333 A | 6/1990 | Henry |
| 4,934,582 A | 6/1990 | Bertram et al. |
| 4,938,410 A | 7/1990 | Kondo |
| 4,942,997 A | 7/1990 | Sinkunas et al. |
| 5,024,366 A | 6/1991 | Kim |
| 5,072,874 A | 12/1991 | Bertram et al. |
| 5,102,028 A | 4/1992 | Glovatsky et al. |
| 5,125,560 A | 6/1992 | Degani et al. |
| 5,148,969 A | 9/1992 | Boucher et al. |
| 5,152,448 A | 10/1992 | Williams |
| 5,154,793 A | 10/1992 | Wojnarowski et al. |
| 5,164,037 A | 11/1992 | Iwami et al. |
| 5,174,016 A | 12/1992 | Todd |
| 5,216,803 A | 6/1993 | Nolan et al. |
| 5,219,520 A | 6/1993 | Brofman et al. |
| 5,259,546 A | 11/1993 | Volk |
| 5,278,393 A | 1/1994 | Kim |
| 5,326,016 A | 7/1994 | Cohen et al. |
| 5,378,290 A | 1/1995 | Tazi et al. |
| 5,402,563 A | 4/1995 | Satoh et al. |
| 5,419,481 A | 5/1995 | Lasto et al. |
| 5,433,368 A | 7/1995 | Spigarelli |
| 5,439,637 A | 8/1995 | Moyer |
| 5,458,281 A | 10/1995 | Downing et al. |
| 5,504,681 A | 4/1996 | Sherman |
| 5,511,496 A | 4/1996 | Schoener et al. |
| 5,526,978 A | 6/1996 | Nagatsuka et al. |
| 5,549,240 A | 8/1996 | Urban |
| 5,552,579 A | 9/1996 | Krueger |
| 5,553,766 A | 9/1996 | Jackson et al. |
| 5,560,531 A | 10/1996 | Ruszowski |
| 5,579,979 A | 12/1996 | Kurpiela |
| 5,605,277 A | 2/1997 | Jackson et al. |
| 5,613,633 A | 3/1997 | French et al. |
| 5,620,132 A | 4/1997 | Downing et al. |
| 5,683,040 A | 11/1997 | Jakob et al. |
| 5,702,051 A | 12/1997 | Leicht |
| 5,715,592 A | 2/1998 | Mori et al. |
| 5,729,440 A | 3/1998 | Jimarez et al. |
| 5,740,954 A | 4/1998 | Pai et al. |
| 5,743,936 A | 4/1998 | Yokoyama et al. |
| 5,758,817 A | 6/1998 | Chapman |
| 5,769,989 A | 6/1998 | Hoffmeyer et al. |
| 5,782,403 A | 7/1998 | Wang |
| 5,785,237 A | 7/1998 | Lasto et al. |
| 5,810,241 A | 9/1998 | Gabriel et al. |
| 5,843,287 A | 12/1998 | Wicks et al. |
| 5,845,838 A | 12/1998 | Gwiasda et al. |
| 5,868,297 A | 2/1999 | Zabel et al. |
| 5,890,646 A | 4/1999 | Tang et al. |
| 5,909,838 A | 6/1999 | Jimarez et al. |
| 5,927,591 A | 7/1999 | Goins, III et al. |
| 5,979,033 A | 11/1999 | Chang et al. |
| 6,016,668 A | 1/2000 | Greiner et al. |
| 6,039,241 A | 3/2000 | Tucker et al. |
| 6,062,460 A | 5/2000 | Sato |
| 6,089,479 A | 7/2000 | Chang et al. |
| 6,119,919 A | 9/2000 | Kasulke |
| 6,131,791 A | 10/2000 | Masaki |
| 6,135,344 A | 10/2000 | Sakuyama et al. |
| 6,201,930 B1 | 3/2001 | Close et al. |
| 6,216,938 B1 | 4/2001 | Card, Jr. et al. |
| 6,227,434 B1 * | 5/2001 | Bassi .................... B23K 1/018 228/119 |
| 6,235,208 B1 | 5/2001 | Kawashima et al. |
| 6,247,630 B1 | 6/2001 | Terry et al. |
| 6,257,478 B1 | 7/2001 | Straub |
| 6,301,436 B1 | 10/2001 | Hsiao |
| 6,325,270 B1 | 12/2001 | Kuroda et al. |
| 6,336,601 B1 | 1/2002 | Ueno et al. |
| 6,357,648 B1 | 3/2002 | Monno |
| 6,423,945 B1 | 7/2002 | Yokota |
| 6,435,401 B1 | 8/2002 | Miitsu et al. |
| 6,467,671 B1 | 10/2002 | Unagami |
| 6,485,674 B2 | 11/2002 | Schulze et al. |
| 6,550,669 B1 | 4/2003 | Walz et al. |
| 6,568,612 B1 | 5/2003 | Aoki et al. |
| 6,641,712 B1 | 11/2003 | Gibson et al. |
| 6,666,369 B2 | 12/2003 | Matsuki et al. |
| 6,675,454 B1 | 1/2004 | Marschner |
| 6,705,509 B2 | 3/2004 | Tada et al. |
| 6,732,911 B2 | 5/2004 | Matsuki et al. |
| 6,948,650 B2 | 9/2005 | Howell et al. |
| 7,107,661 B2 | 9/2006 | Kamimura et al. |
| 7,296,335 B1 | 11/2007 | Thaveeprungsriporn et al. |
| 7,350,686 B2 | 4/2008 | Onozaki et al. |
| 7,428,979 B2 | 9/2008 | Glever et al. |
| 7,540,078 B1 | 6/2009 | Suetsugu et al. |
| 7,640,649 B2 | 1/2010 | Fukaya et al. |

(56) References Cited

U.S. PATENT DOCUMENTS

| | | |
|---|---|---|
| 7,666,321 B2 | 2/2010 | Shih |
| 7,703,197 B2 | 4/2010 | Moltion |
| 7,886,422 B1 | 2/2011 | Zhou et al. |
| 8,042,727 B2 | 10/2011 | Shirai et al. |
| 8,119,060 B2 | 2/2012 | Inuma |
| 2001/0000208 A1 | 4/2001 | Bergeron et al. |
| 2001/0004990 A1 | 6/2001 | Cox et al. |
| 2001/0006188 A1 | 7/2001 | DeLaurentis et al. |
| 2001/0017313 A1 | 8/2001 | Mays et al. |
| 2002/0033409 A1 | 3/2002 | Cilia et al. |
| 2002/0084307 A1 | 7/2002 | Ruszowski |
| 2002/0088846 A1 | 7/2002 | Bolde |
| 2002/0162880 A1 | 11/2002 | Jackson et al. |
| 2003/0019918 A1 | 1/2003 | Farooq et al. |
| 2003/0034380 A1 | 2/2003 | Kimura et al. |
| 2003/0066869 A1 | 4/2003 | Johnson et al. |
| 2003/0121960 A1 | 7/2003 | Mercado et al. |
| 2003/0141349 A1 | 7/2003 | Liu et al. |
| 2003/0178470 A1 | 9/2003 | Tada et al. |
| 2003/0183678 A1 | 10/2003 | Gold et al. |
| 2004/0011185 A1 | 1/2004 | Ishimatsu |
| 2004/0011850 A1* | 1/2004 | Bayot ............... B23K 1/018 228/19 |
| 2004/0026383 A1 | 2/2004 | Zakel et al. |
| 2004/0041011 A1 | 3/2004 | Bolde et al. |
| 2004/0041012 A1 | 3/2004 | Bezama |
| 2004/0099709 A1 | 5/2004 | Chin |
| 2004/0211815 A1 | 10/2004 | Hsieh et al. |
| 2005/0082352 A1 | 4/2005 | Bolde et al. |
| 2005/0087588 A1 | 4/2005 | Weigler et al. |
| 2005/0171802 A1 | 8/2005 | Rochford et al. |
| 2006/0037188 A1 | 2/2006 | Fukaya et al. |
| 2006/0054657 A1 | 3/2006 | Francis |
| 2006/0076388 A1 | 4/2006 | Sato |
| 2006/0107513 A1 | 5/2006 | Ishikawa et al. |
| 2006/0200965 A1 | 9/2006 | Farooq |
| 2006/0202001 A1 | 9/2006 | Birchall et al. |
| 2007/0004290 A1 | 1/2007 | Moltion |
| 2007/0169330 A1 | 7/2007 | Wu |
| 2007/0251981 A1 | 11/2007 | Chapman et al. |
| 2008/0099536 A1 | 5/2008 | Yamamoto et al. |
| 2008/0124928 A1 | 5/2008 | Shih |
| 2008/0169337 A1 | 7/2008 | Callahan |
| 2008/0251278 A1 | 10/2008 | Johnston |
| 2009/0127321 A1 | 5/2009 | Gottshall et al. |
| 2009/0165292 A1 | 7/2009 | Amurao et al. |
| 2009/0166397 A1 | 7/2009 | Meng |
| 2009/0289100 A1 | 11/2009 | Ishikawa et al. |
| 2009/0321500 A1 | 12/2009 | Okada et al. |
| 2010/0044417 A1 | 2/2010 | Bruck et al. |
| 2010/0055916 A1* | 3/2010 | Shih ............... H01L 21/56 438/704 |
| 2010/0181295 A1 | 7/2010 | Azdasht |
| 2010/0223775 A1 | 9/2010 | Higashi |
| 2010/0301100 A1 | 12/2010 | Ho et al. |
| 2011/0024484 A1 | 2/2011 | Suihkonen et al. |
| 2011/0079634 A1 | 4/2011 | Lee et al. |
| 2011/0079635 A1 | 4/2011 | Dumm et al. |
| 2011/0240716 A1 | 10/2011 | Zinn et al. |
| 2011/0240718 A1 | 10/2011 | Cheung et al. |
| 2011/0240719 A1 | 10/2011 | Takada et al. |
| 2011/0240720 A1 | 10/2011 | Okada et al. |
| 2012/0192406 A1 | 8/2012 | Hafeli et al. |
| 2014/0191019 A1* | 7/2014 | Chen ............... H05K 3/22 228/264 |
| 2014/0217157 A1* | 8/2014 | Brosseau ........... H05K 13/0486 228/264 |
| 2015/0068363 A1* | 3/2015 | Almeida ............... C22B 7/003 75/401 |
| 2017/0135258 A1* | 5/2017 | Villatoro ........... H05K 13/0486 |
| 2017/0239742 A1* | 8/2017 | Vtulkin ............... C22B 25/06 |

FOREIGN PATENT DOCUMENTS

| | | | |
|---|---|---|---|
| GB | 982362 A * | 2/1965 | ............. B23K 1/08 |
| GB | 2 173 136 A | 10/1986 | |
| JP | H02-12830 A | 1/1990 | |
| JP | H03-226365 A | 10/1991 | |
| JP | H07-336042 A | 12/1995 | |
| JP | H10-163625 A | 6/1998 | |
| JP | H11-34058 A | 2/1999 | |
| JP | H11-150362 A | 6/1999 | |
| JP | H11-314084 | 11/1999 | |
| JP | 2004-22607 A | 1/2004 | |
| JP | 2007-294648 A | 11/2007 | |
| JP | 4116184 B2 | 7/2008 | |
| JP | 4374639 B2 | 12/2009 | |
| JP | 4839947 B2 | 12/2011 | |
| KR | 20100071492 A | 6/2010 | |
| WO | WO 02/42016 A1 | 5/2002 | |
| WO | WO 2008/117466 A1 | 10/2008 | |
| WO | WO 2011/130622 A1 | 10/2011 | |
| WO | WO 2011/154607 A1 | 12/2011 | |
| WO | WO 2012/143951 A2 | 10/2012 | |
| WO | WO 2013/151437 A1 | 10/2013 | |

OTHER PUBLICATIONS

Reworking, Removing and "Decapsulating" Cured Epoxies (2009).*
Invitation to Pay Additional Fees for PCT/US2014/015321 dated May 28, 2014.
International Search Report and Written Opinion for PCT/US2014/015321 dated Sep. 19, 2014.
International Preliminary Report on Patentability for PCT/US2014/015321 dated Aug. 20, 2015.
International Search Report and Written Opinion for PCT/US2015/043930 dated Jan. 29, 2016.
International Preliminary Report on Patentability for PCT/US2015/043930 dated Feb. 16, 2017.
Sheng et al., Recovery of gold from computer circuit board scrap using aqua regia. Waste Manag Res. Aug. 2007;25(4):380-3.
Zhou et al., A new technology for recycling materials from waste printed circuit boards. J Hazard Mater. Mar. 15, 2010;175(1-3):823-8. doi: 10.1016/j.jhazmat.2009.10.083. Epub Oct. 30, 2009.
Complete file history for U.S. Appl. No. 13/826,313, filed Mar. 14, 2013.
[No Author Listed], Internet "Home" Page, "Project" Page, "Results" Page and "Fact Sheet" for EU funded project titled "Reclamation of Gallium, Indium and Rare-Earth Elements from Photovoltaics, Solid-State Lighting and Electronics Waste." Obtained from the Internet Archive as available on Sep. 4, 2013. 7 pages. <https://web.archive.org/web/20141208165322/http://www.re-claim.eu/>.

* cited by examiner

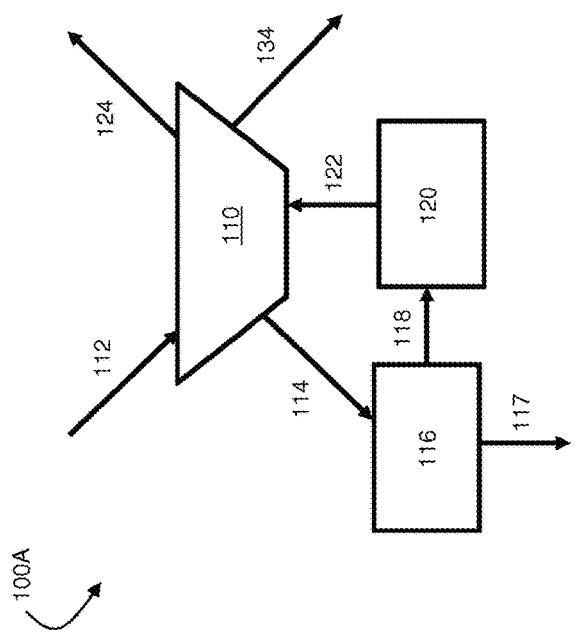

ROTATIONAL REMOVAL OF ELECTRONIC CHIPS AND OTHER COMPONENTS FROM PRINTED WIRE BOARDS USING LIQUID HEAT MEDIA

RELATED APPLICATIONS

This application is a U.S. National Stage Application of International Patent Application No. PCT/US2015/043930, filed Aug. 6, 2015, and entitled "Rotational Removal of Electronic Chips and Other Components from Printed Wire Broads Using Liquid Heat Media," which claims priority under 35 U.S.C. § 119(e) to U.S. Provisional Patent Application Ser. No. 62/033,730,filed Aug. 6, 2014, and entitled "Rotational Removal of Electronic Chips and Other Components from Printed Wire Boards Using Liquid Heat Media," each of which is incorporated herein by reference in its entirety for all purposes.

TECHNICAL FIELD

Systems and methods for the rotational removal of electronic chips and other components from printed wire boards using liquid heat media are generally described.

BACKGROUND

The recovery of electronic chips and other components from the surface of printed wire boards (PWBs) is known. However, many known systems and methods damage the removed chips and/or are environmentally unfriendly. A green, safe, fast, and/or economically efficient process for recovery of electronic components from PWBs, both for re-use of working electronic components in the manufacture of new products and for recovery of metals value for recycling, is desirable.

SUMMARY

The rotational removal of electronic chips and other components from PWBs using liquid heat media, and associated systems and apparatus, are generally described. The subject matter of the present invention involves, in some cases, interrelated products, alternative solutions to a particular problem, and/or a plurality of different uses of one or more systems and/or articles.

In some embodiments, a process for the removal of electronic components attached to a surface of a printed wire board (PWB) with solder is described. In certain embodiments, the process comprises immersing a rotatable housing containing the PWB at least partially into in a liquid heat medium within a heating vessel at a temperature higher than the melting temperature of the solder such that the solder is melted, and rotating the rotatable housing.

In certain embodiments, the process comprises immersing a rotatable housing containing the PWB in a liquid heat medium within a vessel at a temperature higher than the melting temperature of the solder such that the solder is melted, transporting at least a portion of the liquid heat medium and at least a portion of the solder out of the vessel, at least partially separating the solder from the liquid heat medium, and recycling at least a portion of the liquid heat medium to the vessel.

In some embodiments, the process comprises immersing a rotatable housing containing the PWB in a first liquid heat medium within a first vessel at a temperature higher than the melting temperature of the solder such that the solder is melted, and immersing the PWB in a second liquid heat medium within a second vessel at a temperature sufficiently high to remove the underfill.

The process comprises, in some embodiments, immersing the PWB in a first liquid heat medium within a first vessel at a first temperature, and immersing a rotatable housing containing the PWB in a second liquid heat medium within a second vessel at a second temperature that is higher than the melting temperature of the solder such that the solder is melted, wherein the first temperature is between about 20% and about 80% of the second temperature, when the first and second temperatures are expressed in degrees Celsius.

According to some embodiments, the process comprises immersing a rotatable housing containing the PWB in a liquid heat medium at a temperature higher than the melting temperature of the solder, such that the solder melts and the electronic components detach from the surface of the PWB; and at least partially separating the detached electronic components from each other according to sizes, densities, and/or optical characteristics of the electronic components.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 1A-1D are schematic illustrations showing various inventive parts of processes for the removal of electronic components from PWBs, according to certain embodiments;

DETAILED DESCRIPTION

Figure 1B:
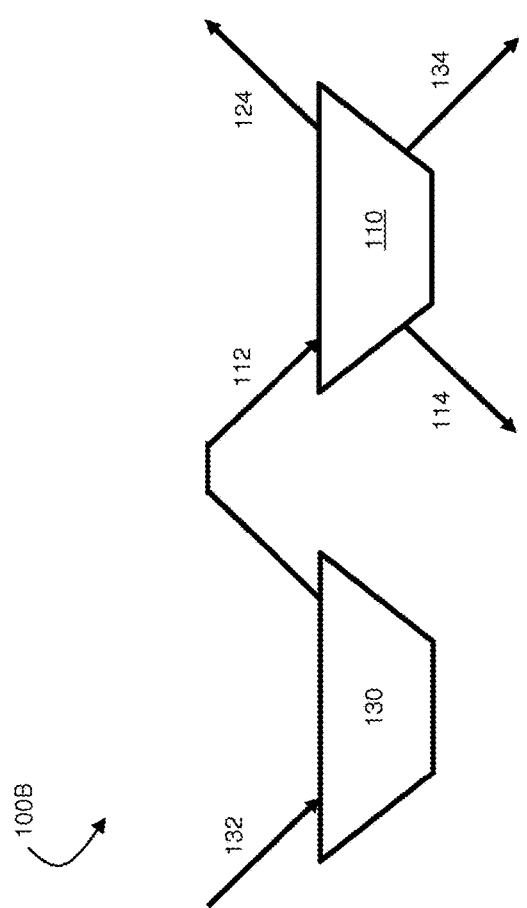
Figure 1C:
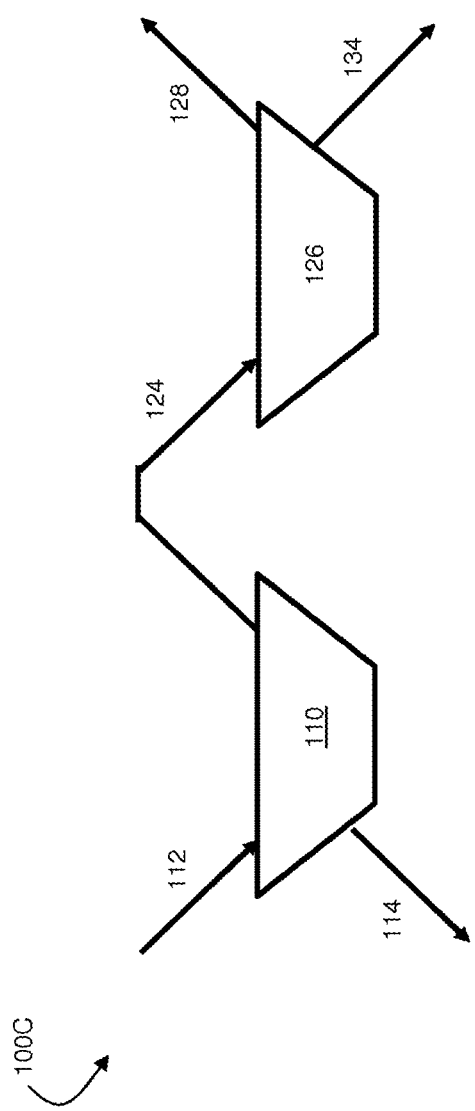

Systems and methods for the removal of electronic chips and other components from PWBs using liquid heat media are generally described. According to certain embodiments, PWBs comprising solder can be positioned within a rotatable housing. The rotatable housing can, in some embodiments, be at least partially immersed within a liquid heat medium. The liquid heat medium can be heated and/or maintained at a temperature sufficiently high to melt the solder. In some embodiments, the rotatable housing can be rotated while it is at least partially immersed in the liquid heat medium. The rotational force can aid, according to some embodiments, in the removal of solder, electronic chips (including those in which an integrated circuit is positioned on a piece of semiconductor material, such as silicon), and/or other electronic components attached to one or more surfaces of the PWB.

In some embodiments, the rotatable housing comprises openings in the wall of the housing. The openings can be sized or otherwise configured to allow the liquid heat medium to be transported into and out of the housing via the wall openings. In certain embodiments, the openings can be sized or otherwise configured to separate the solder from the PWBs and/or the electronic chips and/or other electronic components removed from the PWBs. In some embodiments, the openings can be sized or otherwise configured to separate the electronic chips and/or other electronic components removed from the PWBs from the PWBs. For example, in some embodiments, the openings of the housing can be sized or otherwise configured such that components detached from the PWB may be transported through the wall of the housing. Transporting the detached components from the PWB through the wall of the housing can allow one, according to certain embodiments, to separate certain (or all) of the detached components from the PWB from which they are detached.

The systems and methods described herein can be used to remove solder, electronic chips (including those in which an integrated circuit is positioned on a piece of semiconductor material, such as silicon), and/or other electronic components from PWBs. In some such embodiments, the liquid heat medium may be at least partially separated from the solder and, in some cases, recycled back to a vessel in which the liquid heat medium is stored. The PWBs may be pre-heated, in some embodiments, prior to being immersed in a liquid heat transfer medium in which the solder is removed. In certain embodiments, an additional liquid heat medium may be used to remove underfill from PWBs. In certain embodiments, the electronic components separated from the PWBs may be sorted according to size, density, and/or an optical characteristic.

According to one embodiment, a method is described for desoldering of electronic components from the surface of PWBs, such as motherboards, TV boards, RAM sticks, SCSI cards, cell phone boards, network cards, video cards, and the like, by removal of electronic chips, plastic connectors, capacitors, transistors, resistors, and/or other types of electronic devices, which have been attached to the surface of PWBs with the solder, by melting the solder in a liquid heat medium and optionally applying an external force in order to separate the electronic components from PWBs.

The recovered electronic components can be further used in at least two ways, according to certain embodiments:

1. In some embodiments, the recovered components can retain their functionality. After having been subjected to the main process, the electronic components (e.g., electronic chips) can be rinsed and an additional coat of solder can be applied to their pins in order to make sure each pin is covered by solder. The components can then be re-used in the manufacture of new products.
2. In certain embodiments, the recovered components can be used as a source of metals. Electronic components represent 30-35% of the weight of a typical motherboard, while the remaining 65-70% of the weight is attributable to the bare board. As the bare board does not contain any precious metals in most cases, substantially all of the precious metals will be concentrated in 30-35% of the board's weight after removal of the electronic components. Accordingly, the method for recovery of electronic components from PWBs can be part of a method for the concentration of precious metals in PWB recycling, in some embodiments.

One set of embodiments relates to a process for treatment of PWBs. The PWBs can be positioned in a heating vessel containing a liquid heat medium at a temperature higher than the melting temperature of the solder. Subsequently, the solder can melt and the electronic components can be detached from the surface of the PWBs. In some embodiments, the solder, the electronic chips, and/or other electronic components can be removed from the surface of the PWBs by gravity and optionally by the use of an external force (e.g., a rotational force). In some embodiments, the bare boards and the recovered electronic components are then taken out of the heating vessel, rinsed, and/or dried.

In certain embodiments, the PWBs can be positioned within a rotatable housing. In some such embodiments, the rotatable housing can be rotated while the PWBs are exposed to the liquid heat medium. For example, in some embodiments, the PWBs can be positioned within a rotatable housing, which housing can be at least partially submerged into a liquid heat medium contained within a heating vessel.

In some embodiments, the solder can then be recovered from the liquid heat medium by recirculation and cooling down to the temperature lower than the melting temperature of the solder. In some such embodiments, the solder can be at least partially separated from the liquid heat medium using any solid-liquid separation technique. Optionally, if a temperature higher than the melting temperature of solder is required to undermine or otherwise remove underfill used to attach some electronic components to the surface of PWBs, the PWBs with such remaining components attached by underfill can be removed from the heating vessel and forwarded to a second heating vessel, in which the temperature is set to a value that allows for the thermal destruction of the underfill, allowing for the detachment of the electronic components from the PWBs.

One set of embodiments relates to the development of a method for the detachment of electronic components from the surface of PWBs by melting the solder, whereby the electronic components are liberated from the bare boards, and, in some embodiments, both the bare boards and the electronic components can be further separately treated for metals recovery. For example, bare boards can be recovered for copper recycling, according to some embodiments. The application of certain embodiments affects substantially exclusively the solder and does not lead to any damage/deplating/loss of precious metals plating.

Certain embodiments are related to a method for concentrating precious metals, whereby PWBs serve as the input material and the recovered electronic components serve as the material in which precious metals are present in a concentrated form.

Some embodiments are related to a method for the recovery of electronic components in a substantially undamaged and working condition.

One set of embodiments is related to a process for the recovery of solder, whereby the solder is reclaimed in the form of a solid metal alloy having the chemical composition equal (or nearly equal) to the chemical composition of the solder applied during the manufacture of PWBs. The recovered solder can be re-used for re-tinning of the recovered electronic components or recycled for metals value.

Certain embodiments are related to a liquid heat medium which can be safely used (in association with certain embodiments) to reduce or minimize heat losses during the process and to accomplish easy separation of the recovered molten solder by cold filtration. The liquid heat medium can be re-used essentially indefinitely, in certain embodiments, generating substantially no waste.

Some embodiments are related to a method of providing very uniform heating of PWB elements through a liquid heat medium, whereby creation of any hot spots and overheating of any material is inhibited or avoided. In certain instances, if such overheating and/or hot spot generation within the PWBs and/or PWB components (which can contain brominated flame retardants, which can be released by thermal decomposition of plastics) is not avoided, dangerous gaseous emissions can be formed. Certain embodiments involve the reduction or elimination of such dangerous emissions.

Certain embodiments are related to a high-speed, effective, and economically efficient process, which can be applied for recycling any type of PWB and/or for recovery of working electronic components, for example, attached to the surface of PWBs with the solder using surface mount, through-hole, ball grid array (BGA), flip-chip, other known types of connections, and/or other later-developed connection technology.

One set of embodiments is related to a green and environmentally friendly process, which employs a non-toxic, non-hazardous liquid heat medium. In some embodiments, the application of the non-toxic, non-hazardous liquid heat medium leads to the creation of little or no hazardous emissions, liquid effluents, and/or dangerous byproducts.

FIGS. 1A-1D are exemplary schematic diagrams illustrating various inventive features that may be present, alone or in combination, in certain of the systems and methods described herein. In system 100A of FIG. 1A, PWBs on which electronic components are attached can be immersed in a liquid heat medium within vessel 110. For example, in certain embodiments, the PWBs may be transported along pathway 112 and subsequently immersed in the liquid heat medium within vessel 110. Immersing the PWBs in the liquid heat medium can result in the removal of solder from the surfaces of the PWBs.

In one set of embodiments, at least a portion of the solder can be removed from the liquid heat medium and at least a portion of the liquid heat medium can be recycled. For example, in FIG. 1A, after the solder has been at least partially melted within vessel 110, at least a portion of the solder can be transported out of vessel 110, for example, within stream 114. In some such embodiments, at least a portion of the liquid heat medium may also be transported out of vessel 110 via stream 114. In certain embodiments, the solder and the liquid heat medium can be at least partially separated in unit 116 (e.g., a filtration unit such as a cold filtration unit, described in more detail below). In some such embodiments, at least a portion of the separated solder can be recycled to vessel 110, for example, within stream 118. In certain embodiments, the liquid heat medium within stream 118 can be reheated, for example, using heater 120, after which the liquid heat medium can be transported to vessel 110 via stream 122. At least a portion of the solder that has been separated from the liquid heat medium can be removed from the system, in certain embodiments. For example, at least a portion of the solder than has been separated from the liquid heat medium can be transported out of system 100A via stream 117. In some embodiments, PWBs from which at least a portion of the electronic components have been removed can be removed from vessel 110 via stream 124. In some embodiments, electronic components that have been removed from the PWBs can be removed from vessel via stream 134.

In certain embodiments (including those in which liquid heat medium recycling is performed and those in which liquid heat medium recycling is not performed), the PWBs may be immersed in a first liquid heat medium within a first vessel at a first temperature, and immersed in a second liquid heat medium within a second vessel at a second temperature that is higher than the melting temperature of the solder such that the solder is melted. For example, referring to system 100B of FIG. 1B, in certain embodiments, PWBs may be immersed within a first liquid heat medium within first vessel 130, for example, by transporting the PWBs along pathway 132. The liquid heat medium within vessel 130 may be used to pre-heat the PWBs, in certain embodiments, such that they are not subject to thermal shock prior to being transported into a hotter liquid heat medium. In some embodiments, the PWBs may be subsequently immersed in a second liquid heat medium, for example, within second vessel 110. In certain embodiments, the PWBs may be transported from first vessel 130 to second vessel 110 via pathway 112. In certain embodiments, the temperature of the first liquid heat medium within first vessel 130 can be between, for example, about 20% and about 80% of the temperature of the liquid heat medium within second vessel 110, when the first and second temperatures are expressed in degrees Celsius.

As noted above, in certain embodiments, the PWB on which solder has been formed is immersed in a liquid heat medium at a temperature equal to or higher than the melting temperature of the solder, which may allow the solder to melt. The solder removal step may allow for the detachment of at least a portion of the electronic components from the PWB. In some embodiments, some or all of the electronic components may be attached to the PWB using an underfill. Generally, the term "underfill" is used herein to refer to non-solder components that are used to attached electronic components to PWBs. In some embodiments, underfill can be polymeric, including thermoset polymers, thermoplastic polymers, or any other type of polymer that can be used to attach electronic components to PWBs. In some embodiments, the underfill comprises a glue. In some embodiments, the underfill may at least partially surround (and, in certain embodiments, encapsulate) the electronic components on the PWB.

In certain embodiments (including those in which liquid heat medium recycling and/or PWB pre-heating are performed and/or those in which liquid heat medium recycling and/or PWB pre-heating are not performed), the PWB to which components have been attached using an underfill can be submerged in an additional liquid heat medium (e.g., in an additional vessel) at a temperature sufficiently high to result in removal of the underfill. For example, referring to system 100C of FIG. 1C, after the PWBs are immersed in the liquid heat medium of vessel 110, the PWBs may be transported along pathway 124 and submerged within a liquid heat medium within vessel 126. The temperature of the liquid heat medium within vessel 126 may be sufficiently high to at least partially remove the underfill from the surfaces of the PWBs. In some such embodiments, the PWBs from which the electronic components have been removed can be transported out of vessel 126, for example, via stream 128. In certain embodiments, the electronic components that have been detached from the PWBs can be transported out of vessel 126, for example, via stream 134.

Electronic components can be detached from the surfaces of the PWBs via any suitable mechanism. For example, in certain embodiments, the electronic components can be detached from the surfaces of the PWBs due to gravity. Detachment by gravity can be enhanced or replaced by the action of any other force which may be used to separate the components and the bare boards, such as, for example, forces due to scrubbing, stripping, swiping, shaking, brushing, rolling, centrifuging, rubbing, blowing, spraying, pumping, recirculating, purging, sonication, rotation, and/or shearing. In some embodiments, as described in more detail below, at least some of the components (e.g., solder, electronic components, etc.) may be detached from the PWBs via rotating the PWBs (e.g., within a rotatable housing).

When the surface of treated PWBs becomes free from electronic components, the bare boards can be removed from the liquid heat medium.

In some embodiments (including those in which liquid heat medium recycling, PWB pre-heating, and/or underfill removal are performed and/or those in which liquid heat medium recycling, PWB pre-heating, and/or underfill removal are not performed), after the electronic components have been removed from the PWBs, the detached electronic components can be sorted, for example, according to size, density, and/or an optical characteristic (and, in certain embodiments, sent for further treatment). Such separation can be useful to achieve a variety of goals. In certain embodiments, such separations may be used to group the electronic components into two or more streams such that the electronic components within each stream have similar material content (e.g., similar in type and/or quantity). For example, such separations can be used to separate components containing relatively large amounts of precious metals (e.g., at least about 500 mg per kg of electronic component mass or at least about 1000 mg per kg of electronic component mass) from components which do not, effectively concentrating the precious metals. As one particular example, components containing large amounts of silver and palladium can be sorted into a single stream. Such separation may be used, in some embodiments, to group electronic components according to downstream processing operations to which they will be subjected (e.g., to facilitate metals recovery).

Figure 1D:
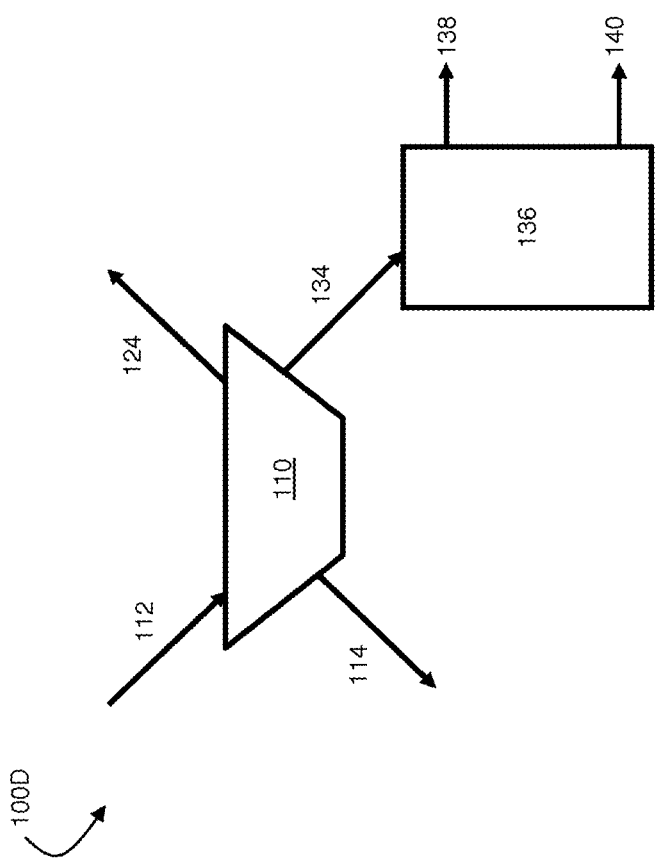

In system 100D of FIG. 1D, for example, electronic components can be transported out of vessel 110 via stream 134 to sorter 136. In FIG. 1D, vessel 110 and sorter 136 are illustrated as discrete pieces of equipment, and detached electronic components are first transferred out of vessel 110 prior to being separated from each other within sorter 136 (and, in certain such embodiments, separated from the liquid heat medium within vessel 110 prior to being transferred to sorter 136). In some embodiments, however, sorter 136 can be attached to or otherwise integrated with vessel 110. In certain such embodiments, the detached electronic components may remain within the liquid heat medium within vessel 110 as the electronic components are being separated from each other using sorter 136. Such arrangements can be constructed, for example, by placing one or more screens within vessel 110. While FIG. 1D illustrates a set of embodiments in which the electronic components removed from vessel 110 are sorted, electronic components removed from an underfill removal vessel (e.g., vessel 126 in FIG. 1C) may also be sorted, in certain embodiments.

In some embodiments, the detached electronic components are at least partially separated from each other according to sizes of the electronic components. Sorter 136 may comprise, for example, at least one screen, which can be used to at least partially separate the incoming electronic components into two or more output streams. For example, in FIG. 1D, sorter 136 can be configured such that at least a portion of the electronic components are passed through at least one screen. The screening step can result in the separation of a first portion 138 of electronic components having a first average size from a second portion 140 of electronic components having a second average size that is smaller than the first average size. In addition, in certain embodiments, separating the electronic components by size comprises passing at least a portion of the electronic components through at least two screens, which can result in the production of three or more streams of electronic components of varying sizes. In certain embodiments, the screen(s) can be vibrated during the electronic component separation step. Vibrating the screens can enhance the efficiency with which the electronic components are separated from each other.

In certain embodiments, the wall of a housing within which the PWBs are located can incorporate a screen, which can be used to sort electronic components based on size, as described in more detail below.

In some embodiments, the detached electronic components are at least partially separated from each other according to the densities of the electronic components. In some such embodiments, the process can result in the separation of a first portion 138 of electronic components having a first average density from a second portion 140 of electronic components having a second average density that is greater than the first average density.

In some embodiments, at least partially separating the detached electronic components from each other according to their densities comprises arranging the detached electronic components on a vibrating surface. In some such embodiments, the surface can be tilted such that the surface comprises a relatively high edge and a relatively low edge. In some embodiments, as the surface is vibrated, less dense components remain close to the high edge while the denser components travel across the surface toward the lower edge of the surface. In certain embodiments, the vibrating surface can be part of a "shaking table" (also sometimes referred to as a "table concentrator"). Exemplary shaking tables suitable for use include, but are not limited to, MD Gemini shaking tables available from Mineral Technologies, St Augustine, Fla.; shaking tables available from Henan Hongxing Mining Machinery Co., Ltd., Zhengzhou, China; and similar.

In certain embodiments, at least partially separating the detached electronic components from each other according to their densities comprises adding the electronic components to a liquid in which one portion of the electronic components float and another portion of the electronic components sink. For example, the electronic components can be mixed with a liquid (a "separating liquid") having a density that is greater than the densities of one portion of the electronic components and less than the densities of another portion of the electronic components. In some such embodiments, the electronic components having densities lower than the separating liquid can float to the top of the separating liquid while electronic components having densities greater than the separating liquid can sink through the separating liquid. The lower density electronic components can subsequently be separated from the higher density electronic components. In some embodiments, multiple such separation steps can be performed (e.g., using two or more settling liquids) to produce three, four, five, or more fractions of electronic components.

The separating liquid can comprise, for example, $[H_2W_{12}O_{40}]^{6-}$ polyanions. In some embodiments, the separating liquid comprises sodium polytungstate (SPT), sodium metatungstate (SMT), lithium metatungstate (LMT), and/or lithium heteropolytungstate (LST) (e.g., in solubilized form). Such materials can be used to prepare water-based solutions with densities of, for example, up to about 3 g/cm$^3$, or more. In some embodiments, tungsten carbide can be added, for example, to further increase the density of the solution. Suitable separating liquid materials can be obtained from, for example, Geoliquids (Chicago, Ill.). While the use of the above-mentioned separating liquid materials can be advantageous in certain embodiments, it should be understood that other separation liquid materials could be used. For example, separation liquids comprising bromoform, tetrabromoethane (TBE), and/or methylene iodide could be used in certain embodiments, although some such liquids may be undesirable for use in certain applications due to potential adverse health effects.

Certain embodiments involve the selection of an appropriate amount of solute (e.g., a solute comprising $[H_2W_{12}O_{40}]^{6-}$ polyanions) and/or solvent (e.g., water) to produce a solution having a density suitable for at least partially separating electronic components according to their densities. For example, an amount of solute and solvent can be selected to produce a separating liquid having a density between the densities of the electronic components within a first portion and the densities of the electronic components within a second portion. In one particular example, the separating liquid can be configured to have a density of, for example, from about 2.5 to about 3.5 g/cm$^3$ (e.g., by adjusting the amount of solute such as sodium polytungstate within an aqueous solution). Plastic-containing electronic components (which may, for example, also contain gold) may have densities of, for example, less than 2.5 g/cm$^3$ (e.g., about 1 g/cm$^3$). Accordingly, the plastic-containing components may float to the top of the separating liquid. In contrast, ceramic-containing components (e.g., ceramic chips) may have densities of, for example, greater than 3.5 g/cm$^3$ (e.g., about 4 g/cm$^3$). Accordingly, the ceramic chips may sink to the bottom of the separating liquid. Subsequently, the plastic-containing electronic components may be separated from the ceramic chips, for example, by skimming the plastic-containing electronic components from the top of the separating liquid.

In certain embodiments, the detached electronic components are at least partially separated from each other according to optical characteristics of the electronic components. In some such embodiments, the process can result in the separation of a first portion 138 of electronic components having a first optical characteristic from a second portion 140 of electronic components having a second optical characteristic. The optical characteristic may correspond to, for example, a color, a shape, a transparency (e.g., a degree of transparency), or any other suitable optical characteristic.

In some embodiments, at least partially separating the detached electronic components from each other according to their optical characteristics comprises using an optical sorter. The optical sorter may be programmed, for example, to recognize and/or sort electronic components based upon their color or other visible markings on the electronic components. Exemplary optical sorters that may be used include, but are not limited to, L-VIS™ and CIRRUS™ optical sorters available from MSS Inc., Nashville, Tenn. and optical sorters available from LLA Instruments GmbH, Berlin, Germany.

In certain embodiments, the detached electronic components can be at least partially separated from each other using a combination of two or more of the methods described herein. In some embodiments, a first separation step may be performed within the vessel containing the liquid heat medium used to detach the electronic components from the PWB. For example, a first separation step in which relatively small chips (e.g., those containing only Ag and Pd) are separated using a small screen can be performed. In some embodiments, after removal of the first fraction of components, the remaining components could be placed on a shaking table. In some such embodiments, electrolytic capacitors (which often have a cylindrical shape) can be separated by allowing the capacitors to roll to the bottom of the table while the remaining components remain at the top of the table. In some embodiments, the electrolytic capacitors can be further separated into multiple streams (e.g., a first stream containing less dense, aluminum-based capacitors and a second stream containing denser, silver- and/or tantalum-containing capacitors) using a dense separating liquid (e.g., any of the separating liquids described above). In some such embodiments, a separating liquid may be used to separate plastic-containing components from non-plastic-containing components (e.g., ceramic-containing components), for example, as described above.

In certain embodiments, the detached electronic components are recovered in working condition and/or are otherwise undamaged. The recovered electronic components may be, according to certain embodiments, re-used in the manufacture of one or more new PWBs. The electronic components can be re-used, in certain embodiments, after removing residues of the liquid heat medium from the electronic components and/or after re-tinning pins of the electronic components.

The systems and methods described herein can be used to remove components from whole PWBs and/or to remove components from shredded or otherwise deconstructed PWBs. The systems and methods described herein can be used to treat populated and/or unpopulated PWBs.

As introduced above with respect to FIG. 1A, certain embodiments involve removing at least a portion of the solder from the liquid heat medium after the solder has been removed from the PWB. During certain embodiments of the process, the molten solder is removed from the surface of treated PWBs, and the solder accumulates within the liquid heat medium (e.g., liquid heat medium within vessel 110) in the form of molten drops. In certain embodiments, the solder droplets are not miscible with the liquid heat medium, so they are present as a separate liquid phase. In some embodiments, solder can be recovered in its metallic form and without any substantial change in its initial composition. In some embodiments, when the liquid heat medium is cooled down to the temperature lower than the melting temperature of the solder, the solder solidifies. After the solder has solidified, it may be separated from the liquid heat medium by simple filtration, decanting, centrifuging or any other known or later-developed solid-liquid separation method. In some embodiments, the solder and the liquid heat medium can be separated to produce a solder-containing stream (e.g., stream 117 in FIG. 1A) that comprises at least about 75 wt %, at least about 90 wt %, at least about 95 wt %, or at least about 99 wt % solder. In certain embodiments, the solder and the liquid heat medium can be separated to produce a liquid heat medium-containing stream (e.g., stream 118 in FIG. 1A) that comprises at least about 75 wt %, at least about 90 wt %, at least about 95 wt %, or at least about 99 wt % liquid heat medium.

In certain embodiments, the solder is recovered in the form of a solid metal alloy. The solder metal alloy may have, in certain embodiments, a chemical composition that is substantially equal to the chemical composition of the solder prior to subjecting the PWB to the solder and/or component removal process. In some embodiments, the solder is recovered in the form of a solid metal alloy having a chemical composition substantially equal to a chemical composition of the solder used in the manufacture of the PWB.

In some embodiments, the liquid heat medium separated from molten solder can then be heated to the process temperature and recycled back to the processing vessel. In such a way, the accumulation of large quantities of molten solder during the process can be avoided, as the solder can be continuously removed from the recirculating liquid heat medium in the form of solid metal. In some such embodiments, the liquid heat medium can be continuously recirculated to and from the vessel in which solder removal is performed. Such operation can lead to significant advantages as the volatilization of dangerous metals can be reduced and/or avoided. In certain embodiments, such processes can be operated such that the loss of heat is minimized, as the liquid heat medium (e.g., within vessel 110) is only cooled down to the highest temperature which allows solder to solidify. For example, if the process temperature is 200° C. and the melting temperature of lead-tin solder is 183° C., the process of cold filtration can be conducted at or near a temperature of just under 183° C. Of course, the cold filtration step may be carried out at any temperature that allows the solder to solidify. For example, in instances in which the solder melts at 183° C., the cold filtration step may be carried out at any temperature lower than 183° C. (e.g., at 182° C., at 175° C., or any other temperature). In certain embodiments, the liquid heat medium is cooled from the liquid heat medium operation temperature (e.g., 200° C. in the example illustrated above) down to the cold filtration temperature (e.g., 175° C.) in order to recover the solid solder, and then heated from the cold filtration temperature (e.g., 175° C.) up to the liquid heat medium operation temperature (e.g., 200° C.) in order to be re-used in the process.

In certain embodiments, the liquid heat medium (e.g., the liquid heat medium that is used to melt solder and/or any other liquid heat medium used in the system) is selected such that it exists in a liquid form at temperatures equal to the melting temperature of solder or higher. The melting temperatures of solders used in the electronics industry generally vary from 183° C. (e.g., for standard lead-tin solder) up to 221° C. (e.g., for lead-free solders) and up to 320° C. (e.g., for high-lead solder). Generally, any liquid which keeps its liquid form at temperatures equal to the melting temperature of the solder, can be used as a liquid heat medium according to some embodiments. In certain embodiments, the liquid heat medium can be operated (e.g., during melting of the solder), at a temperature of at least about 183° C., at least about 185° C., at least about 190° C., at least about 200° C., at least about 250° C., at least about 300° C., or, in certain embodiments, at least about 320° C. (and/or, in certain embodiments, up to about 400° C.). In some embodiments, the liquid heat medium is operated at a temperature that is at least 1° C., at least 2° C., at least 5° C., or at least 10° C. hotter than the melting point of the solder that is removed from the PWB. In embodiments in which multiple solders are to be removed, the liquid heat medium can be operated at a temperature that is equal to, at least 1° C. hotter, at least 2° C. hotter, at least 5° C. hotter, or at least 10° C. hotter than the highest melting point of the solders that are to be removed from the PWB.

In some embodiments, the liquid medium (e.g., the liquid heat medium that is used to melt solder and/or any other liquid heat medium used in the system) has a high flash point (e.g., for security) and/or low viscosity, low evaporation rate, and/or low thermal oxidation rate at working temperatures (e.g., to reduce losses). In certain embodiments, the liquid heat medium has a flash point that is at least about 10° C. higher (e.g., between about 10° C. and about 50° C. or between about 10° C. and about 15° C. higher) than the melting point of the solder that is being removed. In cases where multiple types of solder are being removed, the liquid heat medium can be selected, in some embodiments, such that the flash point of the liquid heat medium is at least about 10° C. higher (e.g., between about 10° C. and about 50° C. or between about 10° C. and about 15° C. higher) than the highest melting point of the solders that are being removed. In some embodiments, the liquid heat medium has a flash point that is at least about 10° C. higher or at least about 25° C. higher (e.g., between about 10° C. and about 50° C. or between about 25° C. and about 50° C. higher) than the working temperature of the liquid heat medium (e.g., 225° C.) during operation of the system.

In certain embodiments, the liquid heat medium (e.g., the liquid heat medium that is used to melt solder and/or any other liquid heat medium used in the system) has a boiling point that is at least about 10° C. higher or at least about 25° C. higher (e.g., between about 10° C. and about 50° C. or between about 25° C. and about 50° C. higher) than the melting point of the solder that is being removed. In cases where multiple types of solder are being removed, the liquid heat medium can be selected, in some embodiments, such that the boiling point of the liquid heat medium is at least about 10° C. higher or at least about 25° C. higher (e.g., between about 10° C. and about 50° C. or between about 25° C. and about 50° C. higher) than the highest melting point of the solders that are being removed. In some embodiments, the liquid heat medium has a boiling point that is at least about 10° C. higher or at least about 25° C. higher (e.g., between about 10° C. and about 50° C. or between about 25° C. and about 50° C. higher) than the working temperature of the liquid heat medium (e.g., 225° C.) during operation of the system.

In certain embodiments, the vapors above the liquid heat medium (e.g., the liquid heat medium that is used to melt solder and/or any other liquid heat medium used in the system) can be at least partially removed, for example, using an exhaust system over the surface of liquid heat medium. In some embodiments, a blanket of inert or otherwise non-reactive gas (e.g., nitrogen, argon, helium) can be positioned over the surface of the liquid heat medium, so the vapors of the liquid heat medium do not accumulate over the surface.

The use of a liquid heat medium (e.g., a liquid heat medium that is used to melt solder and/or any other liquid heat medium used in the system) with a low evaporation rate and/or a low oxidation rate can be important for maintaining low processing costs. If the liquid heat medium oxidizes and/or evaporates quickly, it may be necessary to replenish it more often, which can be relatively expensive. In certain embodiments, the liquid heat medium is selected such that, during operation, less than about 15 wt % (e.g., between about 1 wt % and about 15 wt %) of the liquid heat medium is lost during a 24 hour cycle of exposure of the liquid heat medium to the working temperature.

The use of a liquid heat medium (e.g., the liquid heat medium that is used to melt solder and/or any other liquid heat medium used in the system) with a low viscosity can provide a variety of advantages. For example, it is often easier to establish an even temperature distribution with the low-viscosity fluids. In addition, it can be easier to transfer heat to immersed components (e.g., boards) if low-viscosity liquid heat media are used. The amount of liquid heat medium that remains on the PWBs after removal of the PWBs from the liquid heat medium is also lower when low-viscosity liquids are used, which can reduce loss of the liquid heat medium. Low viscosity fluids are also relatively easy to pump. In some embodiments, the viscosity of the liquid heat medium is about 15 mPa-s or less at the working temperature. In some embodiments, the viscosity of the liquid heat medium is about 15 mPa-s or less at a temperature of about 225° C.

In some embodiments, the density of the liquid heat medium (e.g., the liquid heat medium that is used to melt solder and/or any other liquid heat medium used in the system) at the temperature of operation (e.g., at about 225° C.) is less than about 3.8 g/cm$^3$, less than about 3.5 g/cm$^3$, less than about 3 g/cm$^3$, less than about 2 g/cm$^3$, or less than about 1 g/cm$^3$.

In some embodiments, the liquid heat medium (e.g., the liquid heat medium that is used to melt solder and/or any other liquid heat medium used in the system) comprises a thermal liquid (also sometimes referred to as a heat transfer fluid). Thermal liquids are often used as heat transfer media in heat transfer systems and can be specifically engineered to maintain high thermo-physical stability at high temperatures. In certain embodiments, the liquid heat medium (which can be a thermal liquid) can have a thermal conductivity of at least about 0.1 W/mK at the working temperature of the liquid heat medium during operation of the system. In certain embodiments, the liquid heat medium has a thermal conductivity of at least about 0.1 W/mK at a temperature of about 225° C.

Optionally, small amounts of additives can be added to the liquid heat medium (e.g., the liquid heat medium that is used to melt solder and/or any other liquid heat medium used in the system) in order to improve the ability of the liquid heat medium to resist oxidative breakdown and/or to improve the heat transfer capabilities of the liquid heat medium. These additives can be selected to inhibit or prevent chemical reactions involving the liquid heat medium from occurring. Examples of oxidation inhibitor additives, which can be used, for example, to reduce or prevent the oxidation of hydrocarbons, include but are not limited to zinc dithiophosphates, aromatic amines, alkyl sulfides, and hindered phenols. Examples of phenolic material inhibitors are 2,6-di-tertiary-butylphenol (DBP) and 2,6-di-tertiary-butyl-4-methylphenol or 2,6-di-tertiary-butyl-para-cresol (DBPC).

Examples of liquid heat media which can be used according to the present invention (e.g., to remove solder, pre-heat PWBs, and/or to remove underfill) are: synthetic and natural oils, mineral oils, petroleum oils (e.g., those comprising paraffinic and/or naphthenic hydrocarbons), aromatics (e.g., those compounds comprising benzene-based structures and including the diphenyl oxide/biphenyl fluids, the diphenylethanes, dibenzyltoluenes, and terphenyls), vegetable oils, animal oils, polymeric organosilicon compounds and silicon oils, hybrid glycol fluids, natural and synthetic waxes and paraffins, molten salts, ionic liquids and mixtures thereof, as well as thermal fluids marketed under trademarked names like Dowtherm, Syltherm, Therminol, Duratherm, Calflo, Petro-Therm, Paratherm, Xcelpherm, Dynalene, and the like.

In certain embodiments, the liquid heat medium (e.g., the liquid heat medium that is used to melt solder and/or any other liquid heat medium used in the system) can be substantially free of particulate material (e.g., including less than 0.5 wt % of particulate material or substantially no particulate material), excluding particulate material originating from the PWBs or components of the PWBs.

Examples of solders that can be melted and/or removed from PWBs include those solders comprising Sn, Pb, Ag, Cu, Zn, Bi, Sb, Au, Si, and/or In. PWBs comprising leaded or lead-free solder can be treated. In certain embodiments, the solder contains Sn, optionally in combination with one or more of Pb, Ag, Cu, Zn, Bi, Sb, Au, Si, and/or In. In some embodiments, the solder contains Au and/or Si.

In some embodiments, the liquid heat media described herein can be used to achieve homogeneous heating of the electronic components, the PWBs, and/or the solder. Generally, an article is homogeneously heated if the temperature of the article does not vary by more than about 3° C. across the article.

Figure 2:
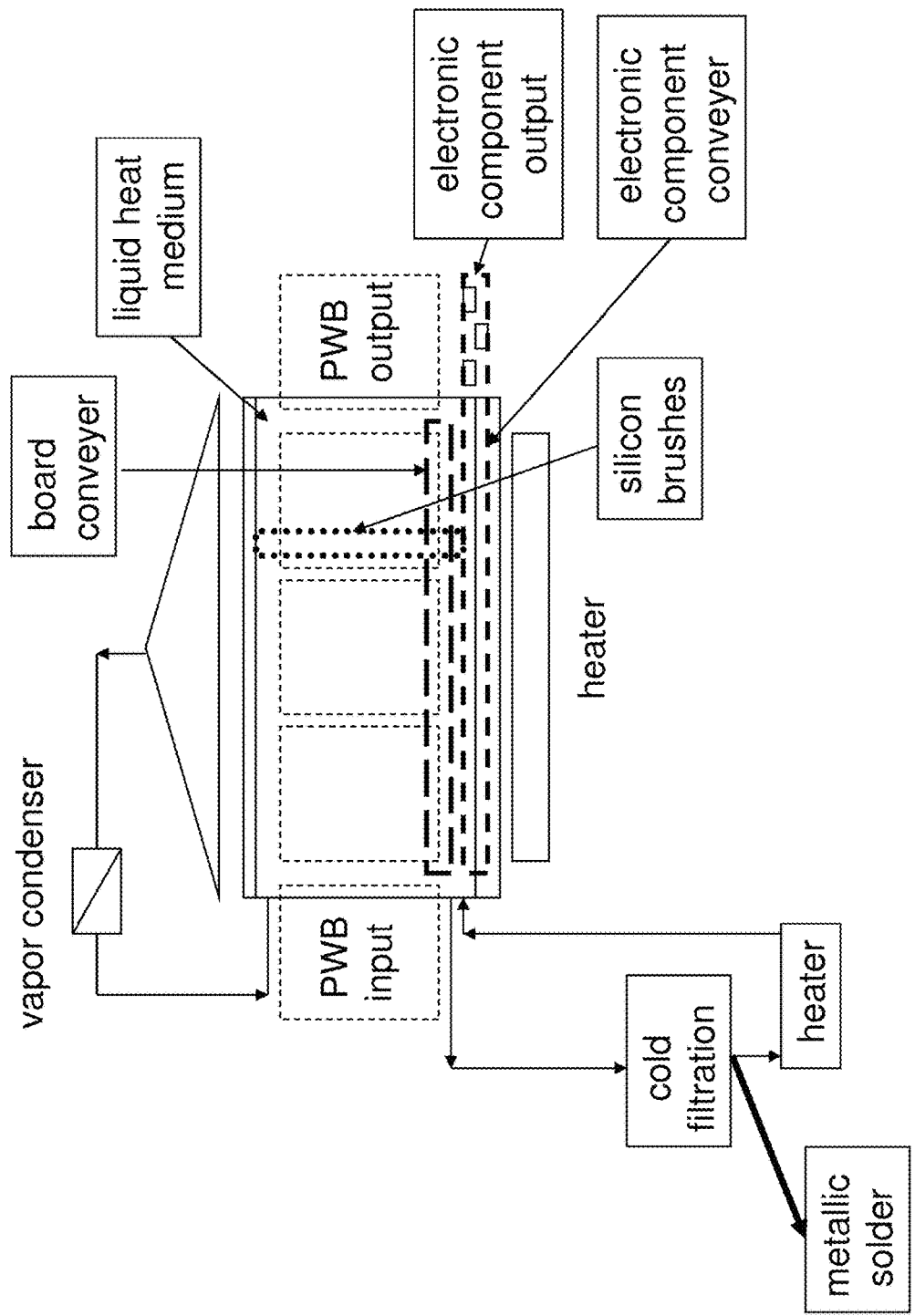
FIG. 2 is a schematic illustration of a system for treating PWBs in a heating vessel and the separate recovery of solder, bare boards, and electronic components, according to one set of embodiments.

A schematic illustration of a desoldering process according to one set of embodiments is given in FIG. 2. According to the configuration illustrated in FIG. 2, PWBs are oriented vertically so that the desoldered electronic components fall off the bare board because of gravity when the solder melts. While the boards illustrated in FIG. 2 are oriented vertically, it should be understood that, in other embodiments, the boards can be oriented horizontally or in any other suitable orientation. In addition, while whole boards are illustrated in FIG. 2, it should be understood that, in other embodiments, shredded or otherwise deconstructed boards can be employed. The PWBs can have electronic components on one side or both sides. The action of gravity can be enhanced, in certain embodiments, by the application of a silicon brush or other mechanical instrument, for example, installed close to the end of the processing line, which can provide a swiping motion that can help to detach the electronic components from the surfaces of the PWBs. In FIG. 2, the PWBs can be placed on the conveyer line and enter the heating vessel from the top of the vessel. The contents of the vessel can be held at a relatively high temperature. In certain embodiments, the contents of the vessel can be held at a temperature of greater than about 222° C. (equal to or greater than, for example, 225° C.), to assure that the temperature of the vessel's contents is higher than the melting temperature of, for example, lead-tin solder (183° C.) and the melting temperature of, for example, lead-free solder (221° C.), so that melting of both types of solder can be achieved.

In certain embodiments, the sides of the vessel can be sloped such that the PWBs are covered gradually by the liquid medium as the PWBs descend into the vessel. The PWBs can be transferred to the vessel using a thermally resistant feeding tool. The residence time for the PWBs in the heating vessel can be adjusted by adjusting the speed of the conveyer so that all of the electronic components detach from the surface of the board by the time the board reaches the exit of the heated vessel. In certain embodiments, the solder melts before the point at which the PWB approaches the silicon brushes. The heaviest components can detach and fall down because of gravity before the board approaches the brushes.

The process illustrated in FIG. 2 includes a conveyer line on the bottom of the vessel, which transports the detached electronic components to the vessel's exit. In certain other embodiments, the liquid heat medium can be recirculated through a set of separators and/or screens, the first of which will capture the largest electronic components and will let the smaller components and the drops of molten solder to pass through, the next of which can separate smaller electronic components, and so on. The sizes of the openings within the separators/screens are generally dependent on the types of separations that are to be made. Typically, the components of the PWBs should be analyzed beforehand in order to determine which size separations would be most important. For example, if the smallest chips contain some silver and palladium and do not contain any other precious metals, it could be useful to select separators/screens having openings (e.g., 5 mm openings) that are capable of separating out the small components.

Finally, as soon as all the electronic components are separated from the liquid heat medium and the liquid heat medium contains only the drops of molten solder, this mixture can be forwarded to a separate vessel, in which the mixture can be cooled down to a temperature at which the molten solder can solidify. In embodiments in which both lead-free and leaded (e.g., lead-tin) solders are processed, in order to allow both lead-free and leaded (e.g., lead-tin) solders to solidify, the temperature in the cold filtration vessel can be kept, for example, at a relatively low temperature. In FIG. 2, the cold filtration vessel may be operated, for example, at about 175° C. In certain embodiments, the temperature within the cold filtration vessel can be equal to or less than about 182° C., equal to or less than about 180° C., or equal to or less than about 175° C. In certain embodiments, the cold filtration vessel can be operated at a temperature that is equal to or less than the melting point of the solder that is being removed (or, in certain embodiments, at a temperature at least 1° C., at least 2° C., or at least 5° C. colder than the melting point of the solder). In embodiments in which multiple solders are being removed, the cold filtration vessel can be operated at a temperature that is equal to or less than the lowest melting point among the plurality of solders (or, in certain embodiments, at a temperature at least 1° C., at least 2° C., or at least 5° C. colder than the lowest melting point of the solders).

The solid pieces of solder can be filtered out of the liquid heat media, and in this way they can be recovered. Subsequently, the thermal liquid may be heated from the lower temperature (e.g., about 175° C. or any temperature within the other ranges specified above, or at another temperature lower than the melting point of the solder(s)) up to the liquid heat medium process temperature (e.g., of 225° C.) and brought back to the heating vessel. The heaters can be selected such that they are capable of providing heat at a rate that produces re-heating of the liquid heat medium at a reasonable rate and to compensate heat losses during processing. The heaters can be configured such that the liquid heat medium contacts the hot surface of the heaters to provide heat exchange. In certain embodiments, it may be advantageous to produce a turbulent liquid flow near the heating surfaces of the heater(s) to provide intensive mixing and heat transfer. Fluid pumping can be achieved using, for example, centrifuge type pumps, which can be especially useful in transporting high volumes of hot fluids. In certain embodiments, fluid-cooled bearings and seals can be used in the pumps.

In general, the components of the system may be fabricated from materials capable of withstanding the high system temperatures, such as mild steel, stainless steel, nickel alloys, other temperature resistant metals, and other temperature-resistant non-metal materials. For example, a stainless steel vessel can be used to house the liquid heat medium used to perform the solder melting process. Stainless steel conveyor systems capable of withstanding such high temperatures are available from, for example, U.S. Tsubaki Power Transmission LLC, Wheeling, Ill. Separators/screens used to perform the electronic component separation step can also be made of any of the temperature-resistant materials mentioned herein, including stainless steel, mild steel, and the like. For example, stainless steel or mild steel screens (in the form of perforated sheets, assembled wires, or in any other suitable form) could be used.

In some embodiments, a vapor collection unit can be installed over the heating vessel in order to inhibit or prevent significant build-up of vapors of the liquid heat medium, which can be especially important if liquid heat media (e.g., thermal liquids) with low flash points are used in the process. In some cases it is advantageous to keep a light vacuum over the vessel in order to prevent oxidation of the liquid heat media. Sometimes a neutral gas blanket can be used for the same or similar purpose. In certain embodiments, the collected vapors can be condensed, recovered, and brought back to the heating vessel.

Figure 3:
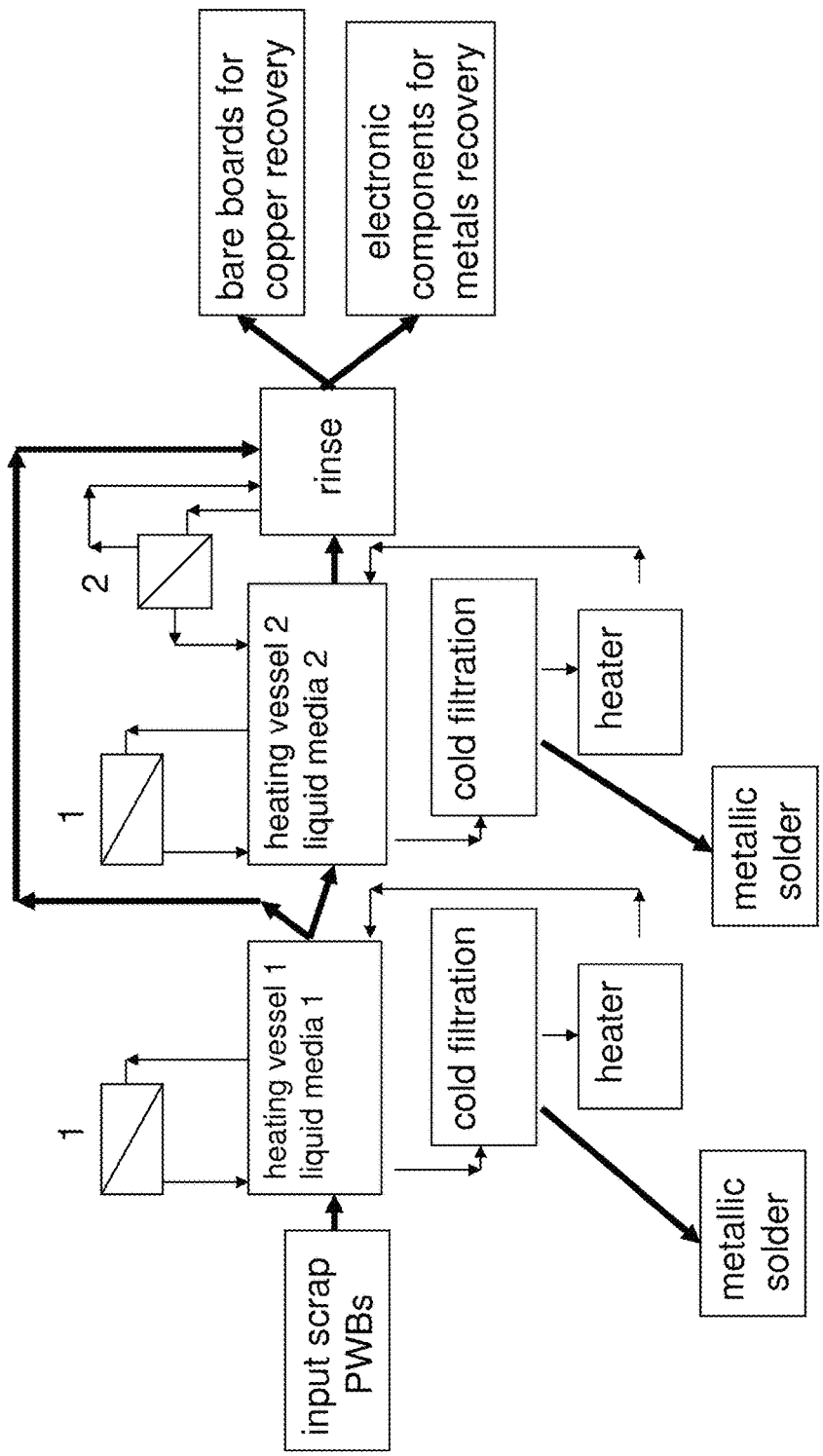
FIG. 3 is, according to certain embodiments, a flow diagram of a process for recycling PWBs.

FIG. 3 is a schematic illustration of a process flow of a recycling operation. In FIG. 3, the electronic components may be collected separately from the bare PWBs and the solder, and can be used in the further recycling of metals. The bare PWBs can be made, for example, of copper clad laminate, typically being copper foils and fiberglass liners, glued together by epoxy. Such materials generally have high densities and are very difficult to grind. For at least this reason, the recycling methods based on grinding of PWBs are generally highly energy consuming, leading to fast equipment wearing and the loss of precious metals. On the other hand, if the bare PWB and the solder are separated from the electronic components by certain methods of the present invention, a significant amount of weight (e.g., more than about 50% of the initial weight of the PWB, in certain embodiments) can be removed from the waste material flow. In some such cases, precious metals could be subsequently recovered in more concentrated form in the electronic components fraction, which can be very advantageous in recycling applications. In cases in which PWBs have surface gold plating, the system can be configured such that the gold plating will not be damaged, removed, or otherwise affected by the employment of certain of the inventive methods described herein. In some embodiments, the bare boards having surface plating may be separated from the rest of the treated boards and subjected to any of a variety of conventional processes for recovery of precious metals plating (e.g., in a downstream process).

As shown in FIG. 3, the PWBs are loaded in the first heating vessel, in which the temperature of liquid heat medium is kept at a temperature at which the solder can be melted. For example, in certain embodiments, the temperature of the liquid heat medium within the first heating vessel is kept at about 225° C. or greater (or any temperature within the ranges outlined above in relation to the operation of the system in FIG. 2). Such temperatures are generally hot enough to cause melting of, for example, both tin-lead and lead-free solder. As a result, the electronic components fall onto the bottom of the heating vessel because of gravity and/or can be scrubbed from the surface of the PWBs by brushes, swipes, rollers, and the like.

In some embodiments, electronic components may be attached to PWBs using an underfill material (e.g., a non-solder underfill material, including certain encapsulatnt materials). Examples of such underfill materials that might be present on PWBs include, but are not limited to, epoxies such as Loctite® Hysol® and Loctite® Eccobond™, both of which are manufactured by Henkel. It is possible that, in certain cases in which the electronic components are attached to the surface of the PWBs using underfill, the electronic components may not be detached. For example, the temperature of 225° C. might not be sufficient to cause the destruction of the underfill polymer. The temperature required to facilitate removal of underfill generally depends on the type of polymer used (e.g., thermal setting polymer, thermally cured polymer, or other polymer types). The temperature needed to remove the underfill can be established experimentally. For example, in certain cases, the temperature needed to remove the underfill may be higher than 225° C. (e.g., 350° C.). In some such cases, the boards leaving the first heating vessel can be visually inspected. If the treated PWB does not contain any electronic components remaining on its surface (e.g., if it is completely bare), it can be forwarded directly to a rinsing operation. If there are any remaining electronic components on the surface of the treated PWB, it can be forwarded to a second heating vessel, the temperature of which may be kept high enough to remove or facilitate removal of underfill (e.g., glues, polymers, or other underfill materials) used to attach electronic components to the surface of the PWB. In certain embodiments, it is advantageous if only the boards containing underfill which cannot be removed by lower temperature within the first heating vessel are treated at a temperature higher than the temperature needed to melt solder (e.g., the temperature of the liquid heat medium used to remove underfill within the second vessel). In such cases, the PWBs from which electronic components have been removed in the first heating vessel will not unnecessarily be heated to higher temperatures, which can be harmful for plastic connectors and lead to plastics degradation, which can cause dangerous gaseous emissions.

In certain embodiments, different liquid heat media can be used within the various heating vessels described herein. For example, referring to FIG. 3, different liquid heat media can be used within heating vessel 1 and heating vessel 2. In some such embodiments, the liquid heat medium used in the second vessel can be selected to be more appropriate for working at higher temperatures than the temperature in the first heating vessel. Some underfills are manufactured to withstand relatively high temperatures (e.g., temperatures of 260° C. or higher). In some such embodiments, liquid media with flash points and/or boiling points higher than the melting temperatures of the underfill (e.g., at least about 10° C. higher or at least about 25° C. higher) can be employed. Examples of such liquid heat media include, but are not limited to, Calflo™ AF (Petro-Canada); Therminol® 75, Therminol® 72, Therminol® 66, and Therminol® 62 (Solutia); and Paratherm NF®, and Paratherm HR® (Paratherm).

In certain embodiments, vapor over the heating vessels may be collected, condensed, and brought back to the vessels. After the removal of electronic components, the bare boards and the electronic components can be rinsed and are subsequently ready for further recycling. The residues of the liquid heat medium can be separated from the rinse water and brought back to the heating vessel in order to minimize losses.

Figure 4:
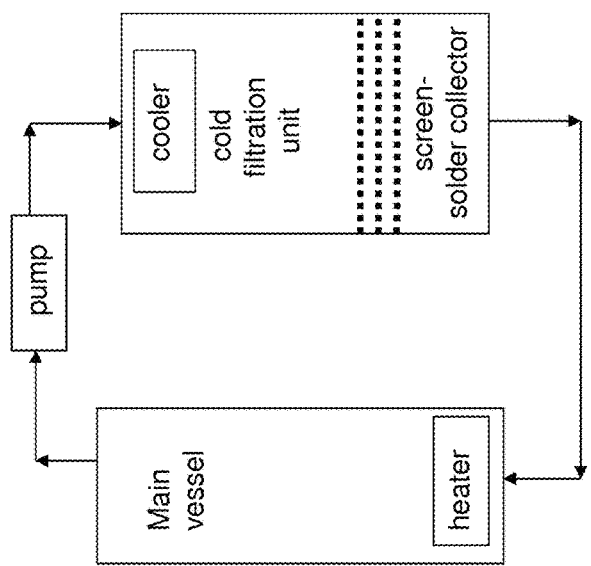
FIG. 4 is, according to some embodiments, a schematic illustration of a cold filtration operation.

As mentioned above, in some embodiments, cold filtration can be used to recover solder. FIG. 4 is a schematic cross-sectional illustration of a system which can be used to perform cold filtration. As illustrated in FIG. 4, the liquid heat medium containing the solder is transported from the main vessel (with a working temperature of, for example, 225° C.) to a secondary vessel. The liquid heat medium containing the solder can be cooled, for example, over a filter or mesh (e.g., made of stainless steel). As the liquid heat medium is cooled (e.g., to a temperature below the melting point of the solder such as, for example, 175° C.), the solder can be solidified. The solidified solder can be trapped by the filter or mesh. The liquid medium may be subsequently transported through the filter or mesh and subsequently recycled to the main vessel. In some embodiments, the liquid is heated back to the working temperature of the main vessel (e.g., 225° C.) by the time the recycled liquid enters the main vessel.

It should be understood that the inventive systems and methods are not limited to the use of the cold filtration apparatus illustrated in FIG. 4, and in other embodiments, other solid/liquid separation techniques may be employed. For example, in some embodiments, solid solder can be separated from the liquid heat medium using other forms of filtration (optionally enhanced by applying a pressure gradient across the filter), decanting, centrifugation, and the like, in place of or in addition to the cold filtration processes described elsewhere.

Figure 5:
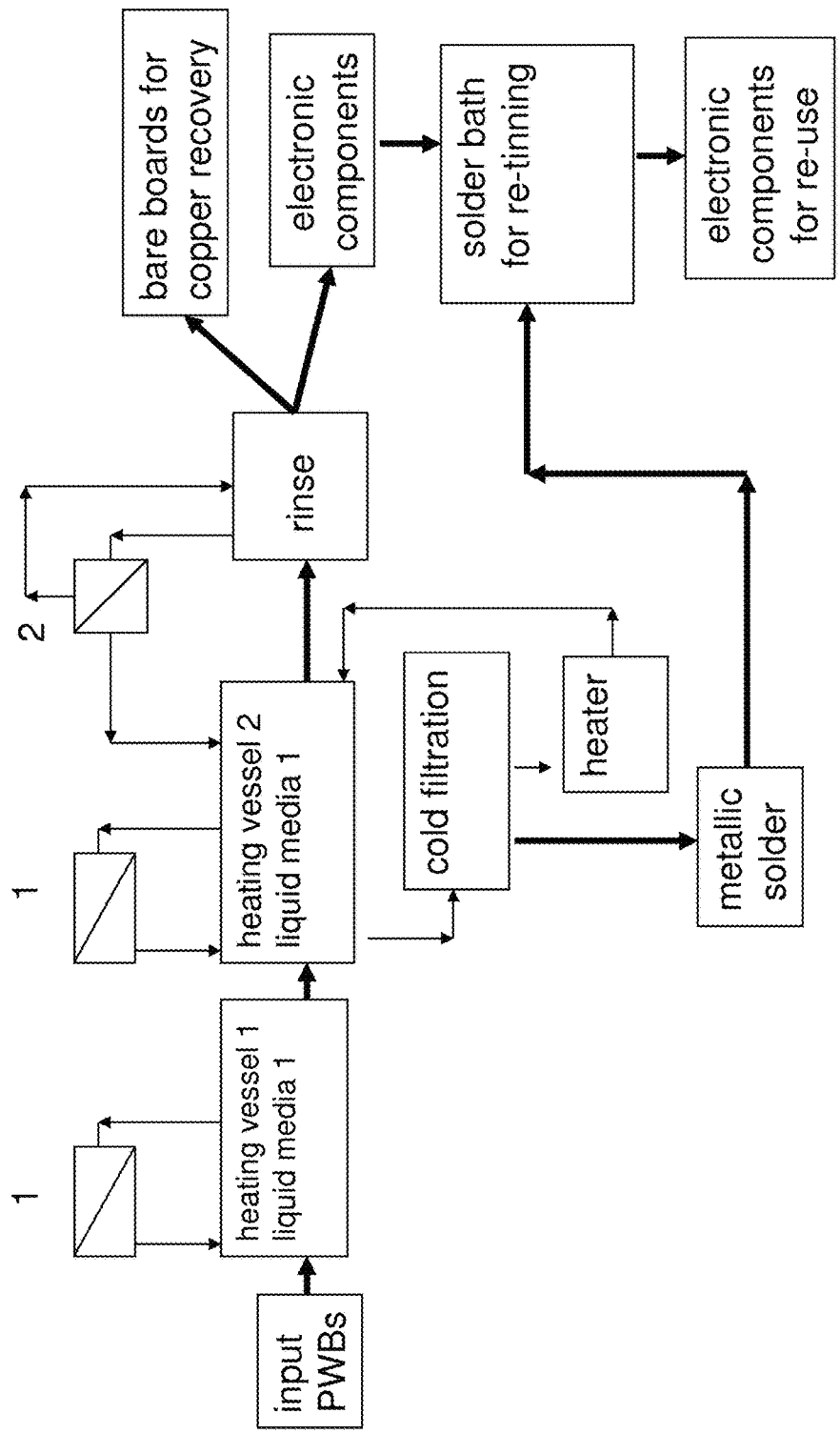
FIG. 5 is a process flow diagram outlining the recovery of working electronic components from PWBs, according to some embodiments.

FIG. 5 is a schematic illustration of an exemplary process for the recovery of working electronic components from PWBs in which the PWBs are pre-heated. Heating PWBs up to the melting temperature of solder generally will not damage the electronic components if thermal shock is avoided, i.e. if heating is relatively slow. In order to avoid thermal shock, a first heating vessel can be used, in which the temperature is kept lower than the melting temperature of the solder (e.g., 125° C. in heating vessel 1 of FIG. 5). As illustrated in FIG. 5, the PWBs are immersed in the first heating vessel and pre-heated, for example, to assure that their temperature does not rise too fast.

The pre-heated boards may then be forwarded to the second heating vessel, in which the temperature of the liquid heat medium can be set relatively high (e.g., to 225° C.), for example, to assure melting of both tin-lead and lead-free types of solder.

In certain embodiments, the PWBs are pre-heated (e.g., within the first vessel) to a temperature, in ° C., that is between about 20% and about 80%, between about 40% and about 80%, or between about 60% and about 80% of the working temperature (e.g., 225° C.) of the liquid heat medium used to melt the solder (e.g., the liquid medium in the second vessel that receives the pre-heated boards). In some embodiments, the pre-heating step comprises heating the boards at a rate of equal to or less than about 2° C. per second.

In some embodiments, the electronic components fall from the bare board and can be recovered. If needed, the temperature can be kept higher than 225° C. for certain electronic components attached with glue or underfill. As described in association with FIGS. 2 and 3, the liquid heat medium can be recirculated through a "cold filter", meaning that the temperature of the liquid heat medium drops down to a temperature which is lower than the melting temperature of the solder, and solder solidifies and is separated from the liquid by, for example, filtration. The cooled liquid heat medium (e.g., at 175° C.) may then be brought back to the second heating vessel and/or can be used to feed the first vessel with hot liquid heat medium. The separated electronic components may be rinsed, dried and forwarded to a re-tinning station, which can comprise, for example, a bath filled with molten solder (e.g., the same type of solder that was originally used to attach the electronic components to the PWB, or another type of solder). The pins of the recovered components can be immersed in the molten solder so that they are completely or nearly completely covered by the solder upon removal of the components from the molten solder. The solder then can be solidified and the components can be re-used. The bare boards can be, in certain embodiments, recycled, for example, to recover metals present on the bare boards.

As noted above, in some embodiments, the PWBs can be positioned within a rotatable housing. In some such embodiments, the rotatable housing can be rotated while the PWBs are exposed to the liquid heat medium. For example, in some embodiments, the PWBs can be positioned within a rotatable housing, which housing can be at least partially submerged into a liquid heat medium contained within a heating vessel. The rotatable housing embodiments described herein (including the description in the paragraphs below) can be used in conjunction with the process flows described herein (including those described with respect to FIGS. 1A-1D above). For example, in some embodiments, the rotatable housing can be used to at least partially immerse PWBs in vessel 110 and/or vessel 126, described above.

Figure 6:
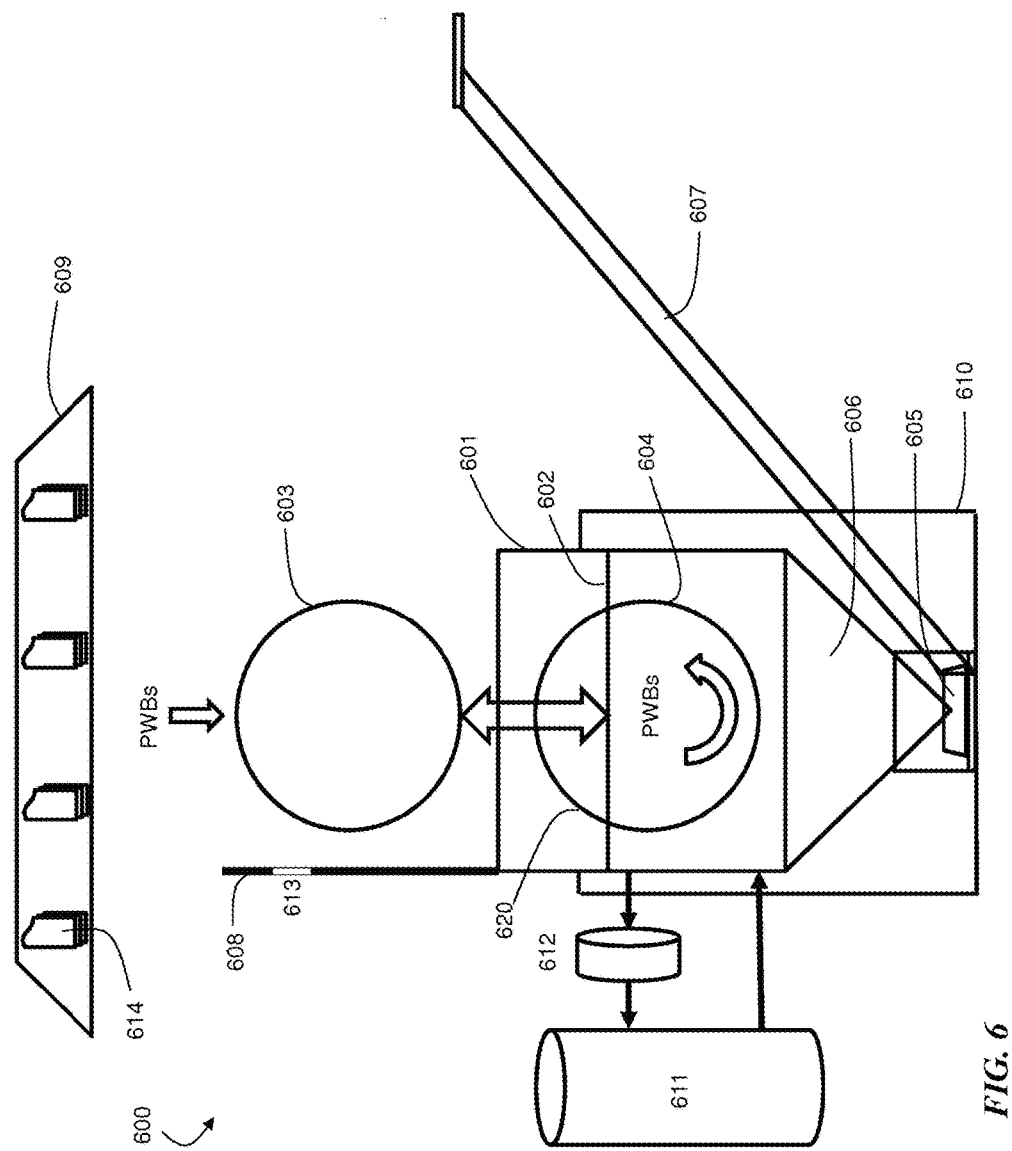
FIG. 6 is a schematic illustration of an exemplary PWB treatment process, according to certain embodiments.
Figure 7:
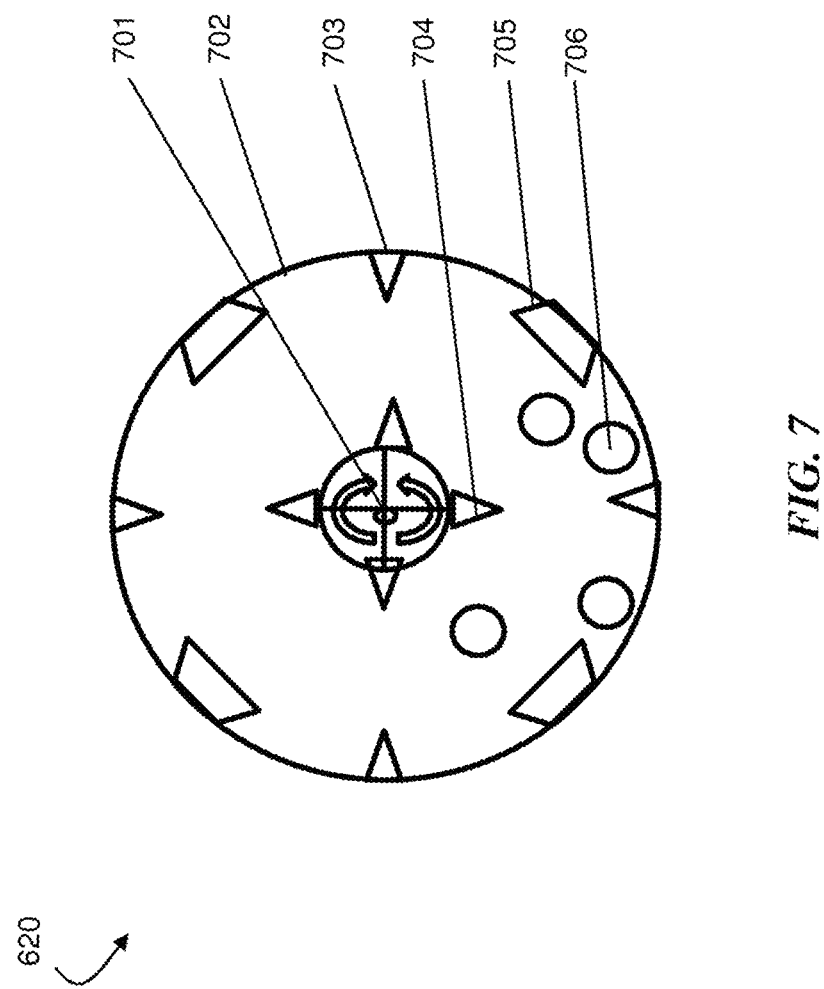
FIG. 7 is, according to some embodiments, a cross-sectional schematic illustration of a rotatable housing.

FIG. 6 is an exemplary schematic illustration of a system 600 in which the PWBs are positioned within a rotatable housing during removal of solder from the PWBs. In FIG. 6, waste PCBs can be positioned within rotatable housing 620, which can subsequently be at least partially immersed within a liquid heat medium within heating vessel 601. Rotatable housing 620 can comprise a rotational axis about which the housing can be rotated during operation. In the particular embodiment illustrated in FIG. 6, heating vessel 601 can be at least partially filled with heated liquid heat medium, for example, up to level 602.

In certain embodiments, the heating vessel comprises a top cover, which can inhibit the degree to which the liquid heat medium is evaporated from the heating vessel. In some such embodiments, the top cover comprises an opening. For example, in FIG. 6, heating vessel 601 comprises opening 613 in top cover 608. The opening in the heating vessel can help prevent pressure build-up within the heating vessel. In some embodiments, the opening in the heating vessel can be positioned such that evaporated liquid heat medium is evaporated to an exhaust vent. For example, in FIG. 6, the liquid heat medium evaporated through opening 613 is transported to exhaust vent 609. The exhaust vent can comprise, in some embodiments, one or more traps within which the hot liquid heat medium can be condensed. For example, in FIG. 6, exhaust vent 609 comprises traps 614, on which hot vapors can condense. In some embodiments, at least a portion of the condensate can be transported back into the heating vessel containing the liquid heat medium. The exhaust vent can be installed over the front of the top tank section in order to capture the fumes of the hot thermal liquid coming out of the rotating barrel and the discharged boards.

In some embodiments, an insulating vessel can be positioned around at least a portion of the heating vessel, which can mitigate heat loss from the heating vessel. For example, in FIG. 6, heating vessel 601 is positioned within insulating vessel 610. The insulating vessel may be made of any suitable material include, but not limited to, glass (e.g., a silicon-based glass), rubber, plastic, and the like.

In some embodiments, the rotatable housing can be rotated while at least a portion of the rotatable housing is immersed within the liquid heat medium.

PCBs can be inserted into the rotatable housing, for example, through an opening (e.g., through a removable side, through a dedicated port, etc.). In some embodiments, after the PCBs have been positioned within the rotatable housing, the housing is closed before the housing is immersed into the heating vessel. Closing the rotatable housing can ensure, in some embodiments, that PWBs are kept inside the rotatable housing after the PWBs have been at least partially immersed in the liquid heat medium.

In some embodiments, PWBs can be positioned within the rotatable housing such that at least a portion (e.g., at least 10%, at least 20%, or at least 30%) of the volume of the rotatable housing is left unoccupied by PWBs. By leaving a portion of the rotatable housing volume unoccupied by PWBs, on can to assure, according to certain embodiments, that the PWBs within the rotatable housing can shift during rotation of the rotatable housing. IN some embodiments, between about ⅓ and about ⅔ of the volume of the rotatable housing is occupied by PWBs after the PWBs have been positioned within the rotatable housing.

In certain embodiments, the rotatable housing is positioned during at least a portion of time in which the system is operated such that only a portion of the rotatable housing is immersed in the liquid heat medium. For example, in some embodiments, between about ¼ and about ¾ of the diameter of the rotatable housing is immersed in the liquid heat medium during at least a portion of time during which the system is operated. In some embodiments, between about 20% and about 80% of the volume of the rotatable housing is immersed in the liquid heat medium during at least a portion of time during which the system is operated.

As noted above, in some embodiments, the rotatable housing can be rotated while it is at least partially immersed in the liquid heat medium. In some such embodiments, the PWBs positioned within the rotatable housing can be exposed to the liquid heat medium while the rotatable housing is rotated. In some embodiments, removal of solder (and/or electronic components and/or other components) from the PWBs can be achieved by melting the solder in the hot liquid heat medium and by simultaneous action of the centrifugal force and the force of gravity. These forces can lead to the movement of PWBs relative to each other (and/or other components within the rotatable housing). This relative movement can result in scrubbing action of the boards' surfaces with each other and/or scrubbing action of the boards' surfaces with other components (e.g., brushes, etc.) within the rotatable housing. In some embodiments, the electronic chips and/or other electronic components, which have been attached to the surface of PWBs using a solder during their fabrication, can be removed from the boards' surface.

As described above with respect to FIGS. 1A-1D, the temperature of the liquid heat medium can be raised to and/or maintained at a temperature at or above the melting point of the solder on the PWBs. In embodiments in which rotatable housings are employed, the temperature of the liquid heat medium can be raised to the relatively high temperature before, during, and/or after at least partially immersing the rotatable housing within the liquid heat medium.

In some embodiments, after the rotatable housing has been at least partially immersed in the liquid heat medium, the rotatable housing can be rotated in one or both directions about its rotational axis. In some embodiments, the rotational speed of the rotatable housing is selected such that the PWBs within the rotatable housing move, such that their surfaces rub against one another. In some embodiments, the PWBs are kept in the hot liquid heat medium for an amount of time such that the solder is heated and is melted, and for the rubbing action between the PWBs (and/or between the PWBs and one or more protrusions in the rotatable housing) to remove the electronic chips and/or other electronic components from the surface of the PWBs, In some embodiments, the liquid heat medium can be heated with a heater (e.g., a boiler or other heater) that is separate from the heating vessel. For example, in FIG. 6, the liquid heat medium can be heated using optional external heater 611. In some such embodiments, hot liquid heat medium is transported (e.g., pumped) from heater 611 to heating vessel 601, after which heat can be transferred from the heated liquid heat medium to the PWBs. In some embodiments, the liquid heat medium within heating vessel 601 can be transported (e.g., pumped) back to heater 611 for re-heating. In some embodiments, the liquid heat medium can be transported between the heater and the heating vessel in a continuous loop, as shown in FIG. 6. In certain embodiments, the liquid heat medium transport conduit can comprise a filter. The filter can be used, in some embodiments, to remove solid impurities and/or products of oxidation of the thermal liquid. For example, in FIG. 6, the liquid heat medium transport conduit comprises filter 612. It should be understood that the use of a heater remote to the heating vessel is optional, and in some embodiments, the heater can be integrated with the heating vessel. For example, in some embodiments, standalone heater can be removed, and a heater can be integrated with heating vessel 601.

In some embodiments, detached chips and/or other electronic components can be transported out of the rotatable housing (e.g., through openings in one or more walls of the rotatable housing). In some such embodiments, the detached chips and/or other electronic components can accumulate on the bottom of the heating vessel. For example, referring to FIG. 6, in some embodiments, detached chips and/or electronic components 605 can accumulate at the bottom of heating vessel 601. In some embodiments, electronic chips and/or other electronic components can be removed from the heating vessel, for example, after cooling down the liquid heat medium. In some embodiments, the bottom of the heating vessel can have a tapered shape (e.g., a substantially conical shape). For example, in FIG. 6, heating vessel 601 comprises tapered bottom portion 606. In some embodiments, the tapered portion of the heating vessel defines an angle of between 15° and 75° (e.g., between 30° and 60°, or between 40° and 50°) with the ground over which the heating vessel is positioned. In some such embodiments, the chips and/or other electronic components that settle to the bottom of the heating vessel can thus accumulate on a relatively small surface.

Electronic chips and/or other removed electronic components can be removed from the heating vessel using any suitable method. In some embodiments, a conveyer line is used to remove electronic chips and/or other electronic components from the heating vessel. For example, in FIG. 6, one end of conveyer line 607 can be positioned at the base of heating vessel 601. In some such embodiments, one end of conveyer line 607 is positioned within heating vessel 601, such that detached chips and/or other electronic components fall onto the line. In some such embodiments, the electronic chips and/or other electronic components are consequently transported out of the heating vessel (with or without liquid heat medium (hot or otherwise) positioned within the heating vessel). Any suitable conveyer system may be used. In some embodiments, the conveyer comprises an auger (e.g., screw) elevator conveyer. In other embodiments, the conveyor comprises a moveable belt. The conveyer can include, in some embodiments, perforations to avoid thermal liquid uptake. In some embodiments, the electronic chips and/or other electronic components can be deposited in a collection vessel (e.g., positioned at the end of the conveyor line).

The rotatable housing can have any suitable shape. Generally, the cross-sectional shape of a rotatable housing is determined when viewing the rotatable housing along its rotational axis (i.e., the cross-section of the rotatable housing is perpendicular to its rotational axis). In some embodiments, the rotatable housing has a substantially circular cross-sectional shape. For example, rotatable housing 620 in FIG. 6 (and in FIGS. 7-10) has a substantially circular cross-sectional shape. In some embodiments, the rotatable housing can be substantially cylindrical or substantially spherical. In some embodiments, the cross-section of the rotatable housing can have at least one substantially flat side. In some embodiments, the cross-section of the rotatable housing can have at least two substantially flat sides that meet at an angle. For example, in some embodiments, the rotatable housing has a substantially polygonal (e.g., substantially square, substantially hexagonal, substantially octagonal, etc.) cross-sectional shape. In some embodiments in which the rotatable housing has at least two substantially flat sides that meet at an angle, the PWBs moving by rotation can be stopped when the edges of the boards fit into the angle (e.g., the angle of the polygon, in some embodiments in which the cross-sectional of the rotatable housing is substantially polygonal). In some such embodiments, the presence of the angle can ensure that better mixing of the boards inside of the rotatable housing can be achieved, which can enhance the scrubbing effect on the electronic components that are to be removed.

In some embodiments, an inner side of the rotatable housing comprises one or more protrusions, which can enhance the scrubbing mechanism by which electronic chips and/or other electronic devices are removed from the PWBs. For example, in some embodiments, an inner side of the rotatable housing may comprise at least one brush, which can provide an additional scrubbing mechanism in order to remove chips from the surfaces of the PWBs. As one example, in FIG. 7, rotatable housing 620 comprises a plurality of brushes 705 extending from the inner side of the rotatable housing. In some embodiments, the inner side of the rotatable housing comprises one or more ribs or baffles. For example, in FIG. 7, rotatable housing 620 comprises a plurality of ribs 703. Protrusions (e.g., brushes, ribs and/or baffles) can provide an additional obstacle for the moving boards. Protrusions (e.g., brushes, ribs and/or baffles) can, according to some embodiments, force the rotating boards to change their trajectory, to turn over, etc.

In some embodiments, the rotatable housing comprises an axle along its rotational axis. In some such embodiments, the axle comprises protrusions. For example, in FIG. 7, rotatable housing 620 comprises axle 701 and protrusions 704 positioned around axle 701.

In some embodiments, non-PWB, non-electronic components (i.e., components that are not PWBs and are not electronic components) can be included in the rotatable housing. For example, in FIG. 7, non-PWB, non-electronic components 706 are located within rotatable housing 620 during operation of the system. Any suitable type of non-PWB, non-electronic components can be used, such as for example, balls, rods, and/or other components. The added components can be made of any suitable material capable of withstanding the temperature of the liquid heat medium, such as metals (e.g., steel, titanium, copper, and high temperature alloys thereof), ceramics, and the like. The added non-PWB, non-electronic components can be added to the rotatable housing to create additional impact on the PWBs, which can aid in chip removal.

In general, the rate of removal of chips and other electronic components from the PWBs can be adjusted based, for example, on a combination of such factors as the rotation speed; the rotation direction; the size of the rotatable vessel; the height, number, and position of protrusions; and the like. In some embodiments, these factors are adjusted to increase (and, in some cases, maximize) the relative motion of the rotating boards and other components within the rotatable vessel (and, as a result, the scrubbing effect).

Generally, the capacity of the rotatable housing will depend upon the dimensions and the size of the PWBs from which chips and other electronic components are to be removed. In some embodiments, the radius of the rotatable housing is equal to or greater than the largest dimension of the PWBs being treated.

In certain embodiments, after the electronic chips and/or other electronic components have been removed from the PWBs, at least some of the electronic chips and/or other electronic components may remain within the rotatable housing (e.g., when at least a portion of the electronic chips and/or other electronic components are not transported through openings of the rotatable housing, as described below). In some such embodiments, the treated PWBs and/or the separated electronic chips and/or other electronic components can be removed from the rotatable housing (e.g., using the same opening in the housing used to load the populated PWBs).

In some embodiments, one or more walls of the rotatable housing comprise openings (e.g., they are perforated). The openings can be of any suitable size and shape. In some embodiments, the openings are in the shape of a four-sided polygon, such as a diamond (e.g., if a stretched diamond shape screen is used to form the walls of the rotatable vessel). When housing walls comprise one or more openings, liquid heat medium can flow into and out of the rotatable housing (e.g., during operation, after operation when the rotatable housing is lifted out of the heating vessel, etc.). In some embodiments, the cumulative size of the openings in the wall(s) of the rotatable vessel are sufficiently large to allow fast evacuation of the liquid within the rotatable vessel (e.g., within 60 seconds or within 10 seconds upon removal of the rotatable vessel from complete immersion within the heated liquid heat medium).

In some embodiments, the wall(s) of the rotatable housing comprises openings, and the maximum cross-sectional dimension of the smallest opening within the housing wall is smaller than the size of the smallest chip and/or electronic component removed from the PWBs. In some such embodiments, the separated chips/electronic components and the bare boards can remain inside the rotatable housing while molten solder is transported out of the rotatable housing (through the openings in the wall(s) of the rotatable housing). In some embodiments, movement of the solder out of the rotatable housing is enhanced via centrifugal forces. In such a way, solder can be removed from the rotating barrel, after which it may accumulate in the heating vessel (e.g., on the bottom of the heating vessel). In some such embodiments, the solder can be removed from the heating vessel (optionally, in sold form after the liquid heat medium has been cooled). In some such embodiments, the separated chips and/or other electronic components can be separated from the bare boards, for example, after removing the rotating barrel from the liquid heat medium.

In some embodiments, electronic chips and/or other electronic components can be expelled from the rotatable housing(s) and may collect at the bottom of the heating vessel. In some such embodiments, after the electronic chips and/or other electronic components have been expulsed through the perforations in the rotatable housing's walls and collected at the bottom of the heating vessel, the electronic chips and/or other electronic components can be removed (e.g., using an auger or screw conveyer as illustrated in FIG. 6).

Solder can also be expelled from the rotatable housing(s), in certain embodiments. The solder can accumulate, in some embodiments, at the bottom of the heating vessel. In some embodiments, the solder solidifies (e.g., when the temperature of the liquid heat medium drops lower than the melting temperature of the solder). In some such embodiments, the solidified solder can be recovered in its solid metallic form, e.g., by filtering the solid solder from the liquid heat medium, as described above.

In certain embodiments, the wall(s) of the rotatable housing comprises openings, and the maximum cross-sectional dimension of at least one (or at least 2, at least 3, at least 5, or at least 10) of the openings within the wall of the rotatable housing is larger than the size of at least one of the electronic chips and/or other electronic components removed from the PWBs. In some embodiments, the maximum cross-sectional dimension of at least one of the openings within the wall of the rotatable housing is larger than the size of the largest chip removed from the PWBs. In some such embodiments, solder and electronic chips (and/or other electronic components) removed from the PWBs can be transported out of the rotatable housing (e.g., via centrifugal force). In some such embodiments, only bare PWBs remain inside the rotatable housing at the end of the process.

In some embodiments, the sizes of the openings in the wall(s) of the rotatable housing can be selected such that only a portion (e.g., the smallest portion) of the electronic chips and/or electronic components that are removed from the PWBs are passed through the wall(s) of the rotatable housing during operation. By using rotatable housings with such openings, one can provide basic separation of the removed chips and/or other electronic components by size. Such separation can be used to selectively separate certain chips and/or other electronic components having desirable properties. For example, in some cases, it may be known that certain metals are found only in chips/components within a certain size range, in which case, it may be desirable to separate on the basis of size as a first step in separating metals for recycling.

In some embodiments, two or more rotatable housings can be used. In some such embodiments, the two or more rotatable housings may be nested (i.e., positioned one within the other). For example, in some embodiments, a first rotatable housing is positioned within a second rotatable housing. In some such embodiments, the first and second rotatable housings can be positioned within a third rotatable housing. In some embodiments, two nested rotatable housings may be positioned such that they are co-axial with each other (i.e., the rotatable axis of the first rotatable housing may be positioned in the same position as the rotatable axis of the second rotatable housing), such as when the first and second rotatable housings share a common rotation axle.

Figure 8:
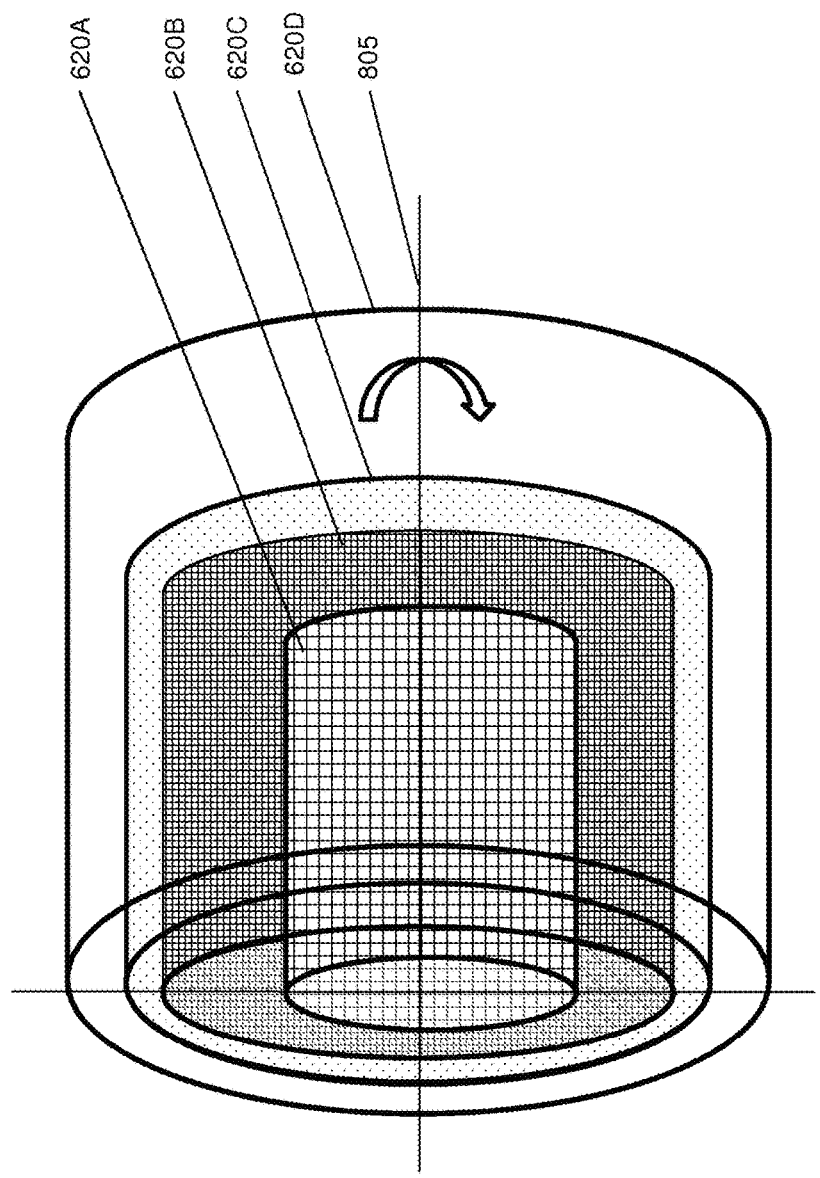
FIG. 8 is a schematic illustration of a plurality of nested rotatable housings, according to some embodiments.

FIG. 8 is an exemplary schematic illustration of a plurality of rotatable housings 620 nested within each other. In the set of embodiments illustrated in FIG. 8, first rotatable housing 620A is positioned within second rotatable housing 620B. In addition, first rotatable housing 620A and second rotatable housing 620B are positioned within optional third rotatable housing 620C. First rotatable housing 620A, second rotatable housing 620B, and optional third rotatable housing 620C are also placed within optional fourth rotatable housing 620D. In FIG. 8, each of rotatable housings 620A, 620B, 620C, and 620D are co-axial with each other (as each shares rotational axis 805), although in other embodiments, one or more of rotatable housings 620A, 620B, 620C, and 620D may not be co-axial with any or all of the others.

In some embodiments, the plurality of rotatable housings can be used to perform component separation. For example, in some embodiments, at least the first and the second nested rotatable housings comprise openings that allow the melted solder to pass through the walls of the rotatable housings. In some embodiments, all of the nested rotatable housings except for the outermost rotatable housing comprise openings that allow the melted solder to pass through. In some such embodiments, the outermost rotatable housing is substantially free of openings, such that solder is retained by the outermost rotatable housing. In some embodiments, all of the nested rotatable housings comprise openings that allow the melted solder to pass through.

In some embodiments, the innermost nested rotatable housing comprises openings that allow at least some of the electronic chips and/or other electronic components removed from the PWBs to be transported through the wall(s) of the innermost rotatable housing. In certain embodiments, all of the nested rotatable housings comprise openings that allow at least some of the electronic chips and/or other electronic components removed from the PWBs to be transported through their walls.

In some embodiments, all of the rotatable housings comprise openings that are sufficiently small to retain at least some (or all) of the treated PWBs.

Referring to FIG. 8, in some embodiments, the wall of rotatable housing 620A can include larger openings than the openings in the wall of rotatable housing 620B. The openings in the wall of rotatable housing 620A can also be larger than the openings in the wall of rotatable housing 620C and/or the openings in the wall of rotatable housing 620D. In some embodiments, the wall of rotatable housing 620B includes larger openings than the openings in the wall of rotatable housing 620C and/or the openings in the wall of rotatable housing 620D. In some embodiments, the wall of rotatable housing 620C includes larger openings than are found in the wall of rotatable housing 620D. In some embodiments, at least a portion of the electronic chips and/or other electronic components that are removed from the PWBs are sufficiently small to pass through the openings within the wall of housing 620A, and therefore, will be transported to housing 620B. In some such embodiments, a portion of the electronic chips and/or other electronic components that are removed from the PWBs are sufficiently small to be transported through the openings within the wall of rotatable housing 620B (and, thus, are transported out of housing 620B (e.g., into the heating vessel or into optional housing 620C), while a second portion of the electronic chips and/or other electronic components will be retained within housing 620B. In some such embodiments, a portion of the electronic chips and/or other electronic components that are removed from the PWBs are sufficiently small to be transported through the openings within the wall of optional rotatable housing 620C (and, thus, are transported out of housing 620C (e.g., into the heating vessel or into optional housing 620D), while a second portion of the electronic chips and/or other electronic components will be retained within housing 620C. In certain embodiments, a portion of the electronic chips and/or other electronic components that are removed from the PWBs are sufficiently small to be transported through the openings within the wall of optional rotatable housing 620D (and, thus, are transported out of housing 620D (e.g., into the heating vessel or into another optional nested housing), while a second portion of the electronic chips and/or other electronic components will be retained within housing 620D. Alternatively, in some embodiments, substantially no chips and/or other electronic components may be transported through the walls of housing 620B, housing 620C, and/or housing 620D. In some embodiments, housing 620D (or housing 620C when housing 620D is not present, or housing 620B when housings 620C and 620D are not present) will be substantially free of openings such that the solder removed from the PWBs accumulates in housing 620D (or housing 620C when housing 620D is not present, or housing 620B when housings 620C and 620D are not present).

Figure 9:
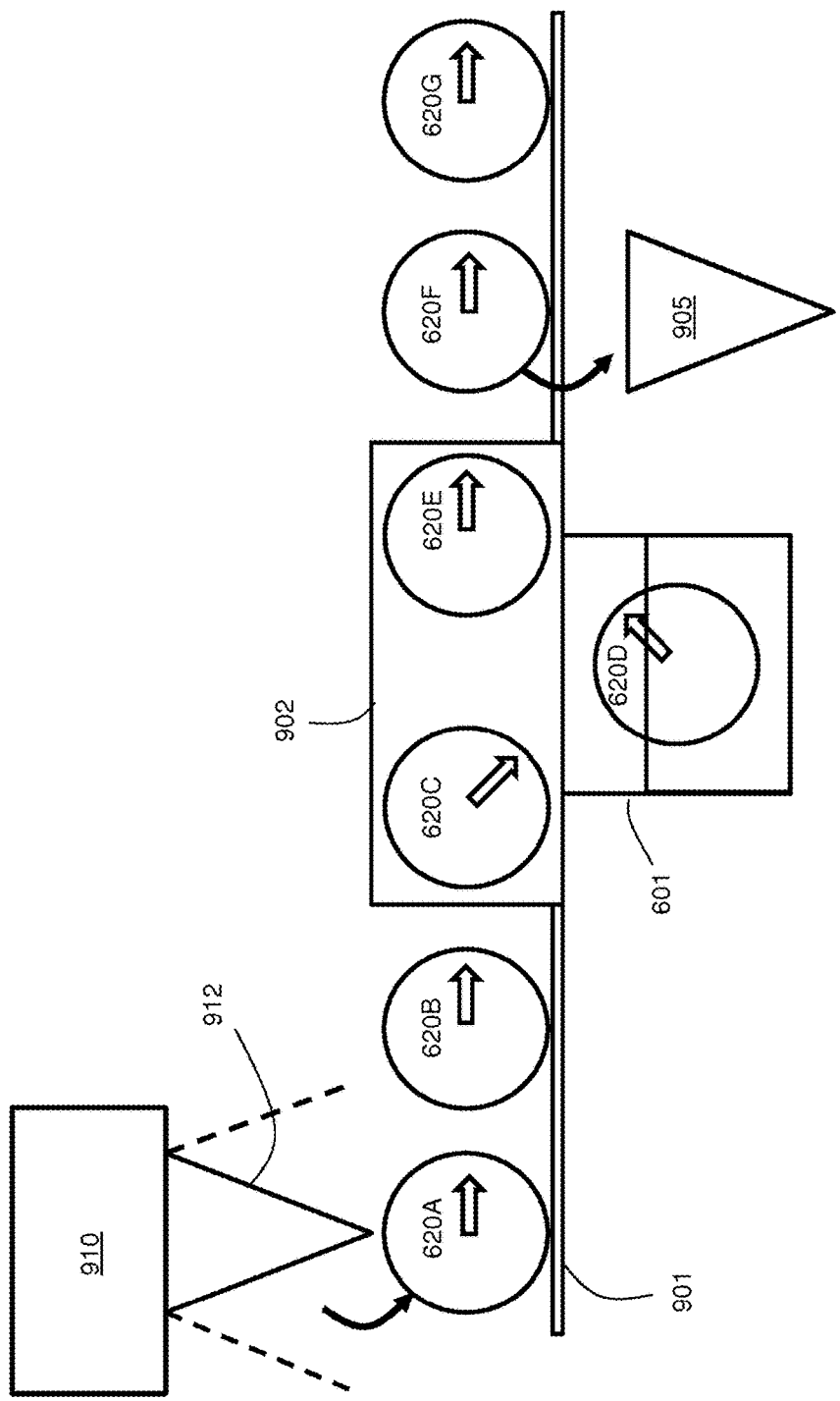
FIG. 9 is a schematic illustration of a PWB treatment process, according to certain embodiments.

In certain embodiments, a plurality of rotatable housings can be used to accelerate PWB processing and/or to increase throughput. In some such embodiments, waste PWBs can be loaded in one rotatable housing while a previously-loaded rotatable housing is being treated in the hot liquid heat medium. FIG. 9 is a schematic illustration of one such system. In FIG. 9, system 900 comprises a conveyer 901 onto which a plurality of rotatable housings 620A-G have been positioned. Empty housing 620A is supplied from one side of conveyor 901. Housing 620B has been loaded with waste PWBs (e.g., by opening a cover, loading the housing, and then closing the cover). The PWBs may originate, for example, from optional storage container 910. Optional storage container 910 can include doors 912, which can be opened to cause the PWBs to fall into the rotatable housing that is being loaded. In some embodiments, after a rotatable housing has been loaded, doors 912 can be closed, conveyor 901 is moved. In some such embodiments, and a new, empty rotatable housing can be positioned under container 910.

Housing 620C has been transported into optional ventilated zone 902. Housing 620D has been placed within heating vessel 601, which contains hot liquid heat medium. Housing 620E has been removed from heating vessel 601 and transported further down conveyor 901. In some embodiments, housing 620E remains in ventilated zone 902 while it cools. Treated PWBs (and, optionally) separated electronic chips and/or other electronic components) can be removed from housing 620F. Optionally, treated PWBs, electronic chips, and/or other electronic components can be stored in bin 905. Housing 920G can be removed from the end of conveyor 901 and reused at the beginning of the process.

In order to attach rotatable housings easily to the heating vessel (and to easily remove the rotatable housings after treatment), one or more quick release couplings can be used. The quick release coupling can allow for fast and easy connection of the rotatable housing to a rotating shaft and/or safe positioning of the rotatable housing within the system (e.g., reducing the chances of the rotatable housing unintentionally unlocking). Examples of such quick release couplings include, but are not limited to, ISO A, ISO B and ISO 16028 quick release couplings. Such quick release couplings are commercially available, for example, from the Hydraulic Megastore, Grimsby, North Lincolnshire, UK; and from New Perfect Industries, Mumbai, India.

In some embodiments, the rotatable housing can have a first position in which the PWBs are loaded and a second position at which the PWBs are at least partially immersed within the liquid heat medium. For example, referring back to FIG. 6, PWBs can be loaded into rotatable housing 620 when it is in its upper position 603. In some embodiments, after PWBs have been placed into a rotatable housing, the opening through which the PWBs were inserted can be closed (and, optionally, locked).

In some such embodiments, after the PWBs have been positioned within rotatable housing 620, rotatable housing 620 can be lowered into lower position 604. In some embodiments, rotatable housing 620 is at least partially immersed in liquid heat medium in lower position 604. Thus, the PWBs in rotatable housing 620 can be exposed to liquid heat medium when rotatable housing 620 is positioned in lower position 604. In other embodiments, of course, other loading configurations are also possible. In some embodiments, the rotatable housing can be pre-loaded at another location, closed, and subsequently positioned within heating vessel 601. The liquid heat medium can be added to heating vessel 601 before, during, and/or after positioning the rotatable housing within the heating vessel.

In some embodiments, after electronic chips and/or other electronic components have been removed from the populated PWBs, the rotatable housing can be removed from the heating vessel (e.g., by opening a cover of the heating vessel and bringing the rotating barrel into its upper position). Some embodiments comprise subsequently opening the rotatable housing (in some cases, unlocking an optional lock on the rotatable housing) and removing the treated PWBs (and, optionally, any separated chips and/or other electronic components that remain within the housing) from the rotatable housing. In some embodiments, the process can be repeated.

Figure 10:
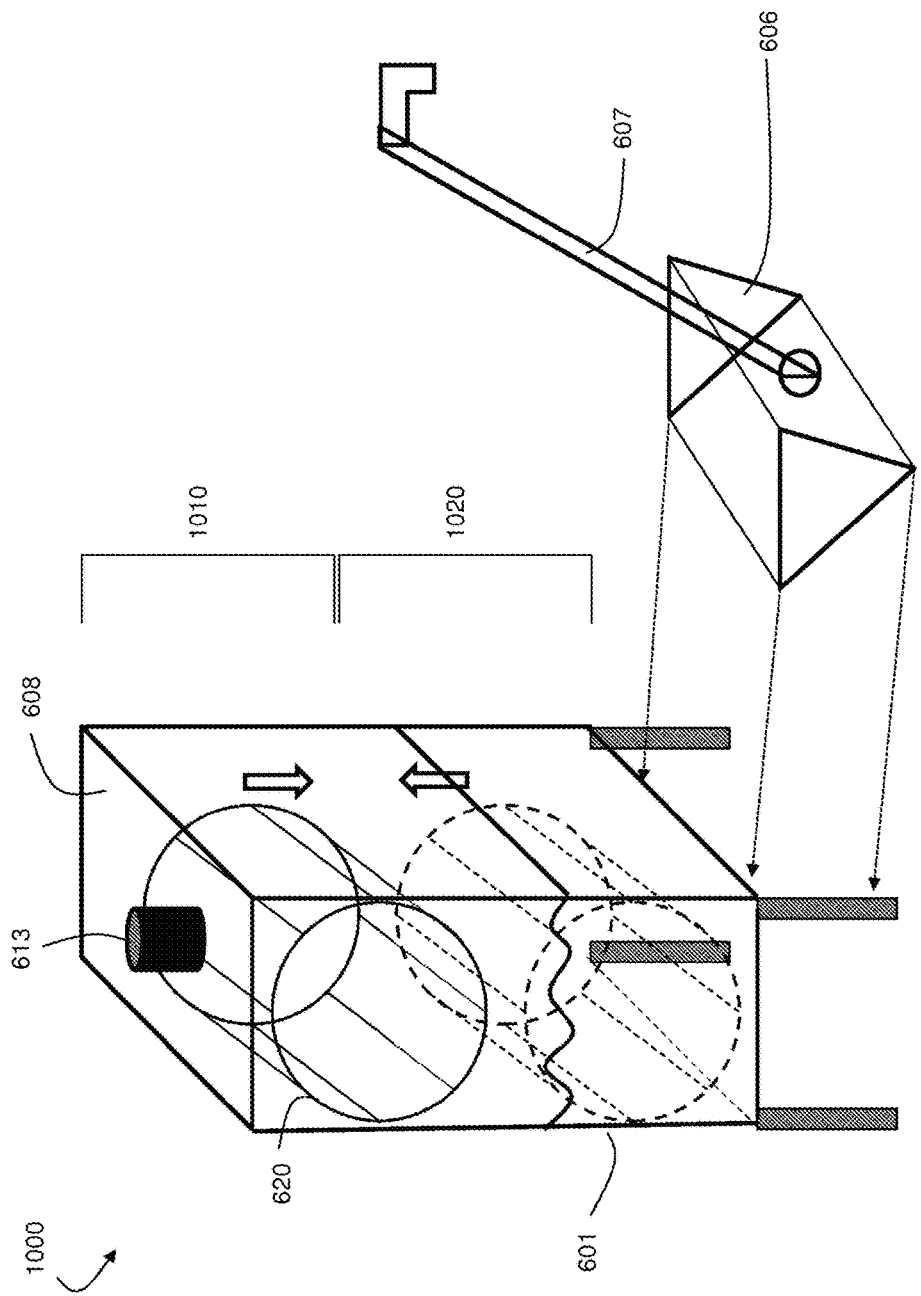
FIG. 10 is a schematic illustration of a PWB treatment process, according to some embodiments.

FIG. 10 is a schematic illustration of exemplary system 1000 that can be used to remove electronic chips and/or other electronic components from PWBs. In FIG. 10, system 1000 comprises top section 1010, within which rotatable housing 620 can be loaded with PWBs. Rotatable housing 620 can be lowered into second section 1020, which can comprise a heating vessel at least partially filled with liquid heat medium. In FIG. 10, tapered portion of heating vessel 601 is illustrated separately from heating vessel 601, for purposes of clarity.

Figure 11:
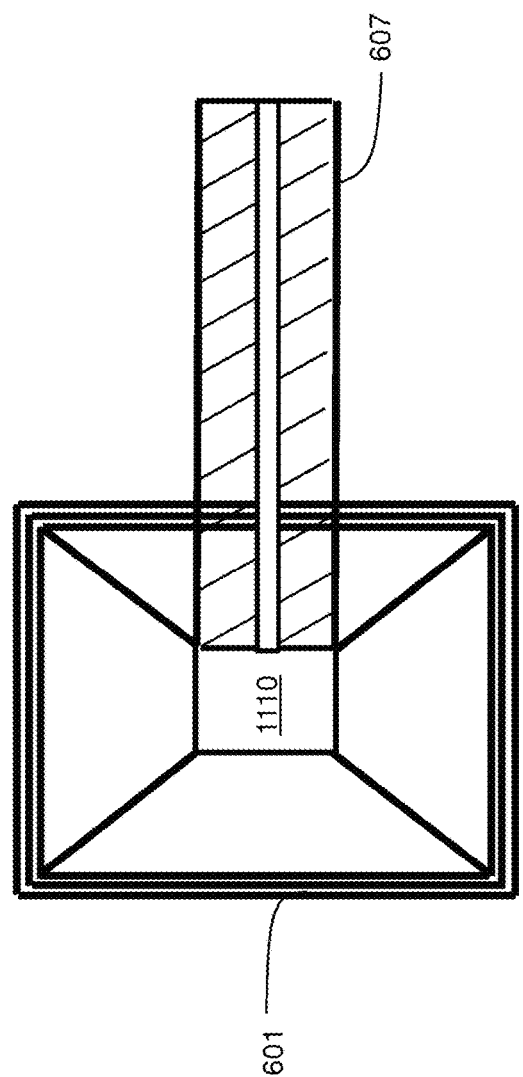
FIG. 11 is a top-view schematic illustration of a heating vessel and conveyor, according to certain embodiments.

FIG. 11 is a top-view schematic illustration of an exemplary heating vessel and conveyor line, which can be employed according to certain embodiments. In FIG. 11, bottom surface 1110 of heating vessel 601 can be in contact with conveyer line 607 such that the material that settles on bottom surface 1110 is transported away from the bottom of the heating vessel via conveyor line 607.

The following examples are intended to illustrate certain embodiments of the present invention, but do not exemplify the full scope of the invention.

EXAMPLE 1

This example describes the use of a liquid heat medium to remove solder and electronic components from PWBs.

A heating vessel was built using a heat mantel with a temperature regulator wrapped around a cylindrical stainless steel vessel. Dynalene 600 thermal liquid was used as a liquid heat medium in the heating vessel. The temperature in the vessel was raised to 220° C., and a waste low grade motherboard was immersed into the hot liquid heat medium. The motherboard was kept in the heating vessel for 3 min and afterwards it was removed for inspection. Some electronic components had already detached from the motherboard's surface and were found on the bottom of the vessel. Light tapping resulted in removal of additional components. The board was immersed in the liquid heat medium for additional 2 min. The board was subsequently removed, and a silicon brush (IMU-71120 by Imusa USA, Doral, Fla.) was used to remove the remaining components from the surface of the motherboard. As a result, the motherboard was found to be completely barren of electronic components on its surface. The electronic components were removed from the liquid heat medium, the bare board and the components were allowed to cool down in open air and afterwards they were weighed. The liquid heat medium was cooled to room temperature so that the solder drops solidified. Subsequently, the solder drops were removed from the liquid heat medium by filtration and weighed.

The weights of the motherboard and its components before and after the desoldering operation are presented in Table 1.

TABLE 1

Mass of the treated waste low grade motherboard and its components.

| | Mass, g | Weight % | Precious metals |
|---|---|---|---|
| Populated motherboard | 583.3 | 100 | Yes |
| Bare board | 211 | 36.2 | No |
| Electronic chips | 22.6 | 3.9 | Yes |
| Connectors and other components | 225.7 | 38.7 | Yes |
| Steel components not containing any precious metals | 82 | 14.0 | No |
| Recovered solder | 42 | 7.2 | No |

The desoldering operation resulted in separation of the materials that did not contain any precious metals from materials containing precious metals. In this way, the precious metals were recovered in a more concentrated form. The bare board, the steel components, and the solder did not contain any precious metals, and they together represented 57.4% of the initial mass of the motherboard. This material can be separated from the incoming material flow in the recycling operation and it can be removed from the recycling process with no additional operations required. On the other hand, traditional recycling methods apply size reduction to the total weight of the electronic waste, which requires much more energy and resources than the method described in this example (and in certain embodiments described elsewhere herein).

To determine the precious metals content, the electronic chips (22.6 g) and other electronic components such as resistors, capacitors, and plastic connectors (225.7 g) were ground in a laboratory ball mill cooled by liquid nitrogen. The two separate powder samples were subjected to a nitric acid leach followed by a two-hour leaching with boiling Aqua Regia. The concentrations of gold, palladium, and silver in the ground material are presented in Table 2.

TABLE 2

Concentration of precious metals in chips and components, recovered from the treated waste low-grade motherboard.

| | Mass, g | Au, mg/kg | Pd, mg/kg | Ag, mg/kg |
|---|---|---|---|---|
| Electronic chips | 22.6 | 1395 | 260 | 3308 |
| Electronic components | 225.7 | 45 | 144 | 34 |

The electronic chips contained significantly higher concentrations of precious metals than the electronic components. Thus, the desoldering operation in this example resulted in the separation of a 3.9%-weight fraction containing high concentrations of precious metals, a 38.7%-weight fraction containing low concentration of precious metals, and a 57.4%-weight fraction containing no precious metals from a typical waste low grade motherboard.

EXAMPLE 2

A waste SCSI card was subjected to the desoldering operation described in Example 1. The weights of the SCSI card and its components are presented in Table 3.

TABLE 3

Mass of the treated SCSI card and its components.

| | Mass, g | Weight % | Precious metals |
|---|---|---|---|
| Populated SCSI card | 211 | 100 | Yes |
| Bare board | 114 | 54 | No |
| Electronic chips | 71.5 | 33.9 | Yes |
| Electronic connectors | 18.5 | 8.8 | Yes |
| Recovered solder | 7 | 3.3 | No |

The bare board did not contain any precious metals and represented 54% of the card's original weight. It is generally very advantageous to eliminate this weight from the material flow in a precious metals recycling operation; the bare board can be sent for copper recovery as it does not contain any other metals. Additionally, 3.3% of the original card's weight in the form of solder alloy was recovered, which can be also recycled for its metal value. The electronic chips (71.5 g) and the electronic connectors (18.5 g) were ground in a laboratory ball mill cooled by liquid nitrogen. The two separate powder samples were subjected to a nitric acid leach followed by a two-hour leaching with boiling Aqua Regia. The concentrations of gold, palladium, and silver in the ground material are presented in Table 4.

TABLE 4

Concentration of precious metals in chips and connectors, recovered from the treated waste SCSI card.

| | Mass, g | Au, mg/kg | Pd, mg/kg | Ag, mg/kg |
|---|---|---|---|---|
| Electronic chips | 71.5 | 1018 | 839 | 4760 |
| Electronic connectors | 18.5 | 1710 | 790 | 52 |

The electronic connectors contained visible surface precious metals plating, so there was no need to grind them to get access to precious metals. The plastic connectors can be recovered separately from the ceramic electronic chips and the precious metals plating can be easily recovered from their surface by any suitable chemical method. As a result, only electronic chips, which represent 33.9% by weight of untreated SCSI card, need to be ground for precious metals recovery.

PROPHETIC EXAMPLE 3

This example describes a continuous process in which electronic chips and other electronic components can be removed and recycled from PWBs. A main working reservoir can be filled with liquid heat medium. Heaters associated with the main working reservoir can be switched on and pumps can start recirculation of the liquid heat medium inside of the working reservoir, resulting in fast heating of the volume of the liquid heat medium up to a working temperature of, for example, 225° C. The PWBs can be loaded into a feeding unit and the unit can be attached to a feed. The PWBs can be attached to clasps of the chain conveyer one by one and as movement of the conveyor is initiated, the boards can move forward and, at the same time, begin to be immersed in the hot liquid heat medium (because the conveyer is descending). As soon as the boards become completely immersed in the hot liquid heat medium, the conveyer can become horizontal. The boards can be moved inside of the working vessel at a speed which allows the solder to melt completely as soon as the board arrives close to the end of the horizontal section. Rotating silicone brushes can be installed on the sides of the main working reservoir at distances of ½ and ¾ of the length of the horizontal section; when rotating, the brushes provide a scrubbing effect from the two sides of the PWB, helping to remove the electronic components. The turbulent flow of recirculating liquid heat medium can hit the components and provides additional force serving to detach the components from the surface of the board. In this way, the boards which have arrived to the end of the horizontal section can be free of all the components from their surfaces and can be in the form of bare boards. The boards can then enter the upward section of the conveyer, being gradually removed from the hot liquid heat medium. The boards taken out of the liquid heat medium can continue their horizontal motion and enter a section in which an air knife is applied to blow away the residual liquid heat medium from the surfaces of the boards. The air carrying liquid heat medium and residues can be fed to a condenser, in which the liquid heat medium is collected and brought back to the working reservoir. After passing the air knife, the boards are sprayed with a cleaning liquid, which cleans liquid heat medium residues which were not removed by the air knife from the surfaces of the boards. In certain cases, the cleaning liquid preferably has a basic pH (e.g., a pH of 9-11). Any effective cleaning agent can be used, such as common detergents and special cleaning fluids (e.g., DiAqua sold by RPM Technology). As the boards exiting the process are hot, cold air can be used for the air knife, in certain embodiments. In addition, the cleaning liquid can be recirculated and cooled. The vapors of the cleaning liquid can be collected, condensed, and brought back to the cleaning liquid reservoir. As the final step, the boards can be dried, detached from the clasps, and removed from the process. The collected boards can be transferred out for copper recycling. The vapors collection unit (which can have a variable flow rate) can be installed over the open working surface of the liquid heat medium so that the vapors are captured, condensed and brought back to the working reservoir.

The electronic components detached from the surface of the PWBs can be collected on the bottom of the working reservoir, which can have a V-shaped bottom. When such reservoirs are used, the components will generally collect at the lowest point of the bottom of the reservoir. A removable cylindrical section (i.e., a chip removal section) can be attached to the lowest point of the bottom of the working reservoir so that the detached components accumulate in the upper portion of the cylindrical section. The chip removal section can contain several different mesh screens along its height, so that the screen with the largest openings is installed at the highest level, and the screen having the smallest openings is installed at the lowest level. The highest screen will retain only the largest components; the rest of the components will drop down onto subsequent screens having smaller mesh sizes (and which will retain smaller components than the first screen) allowing smaller components to pass down to smaller meshes. The screen mesh sizes can be chosen in such a way that the electronic components can be separated by size in preferred categories, for example, categories based on metals content and/or after-treatment steps. The liquid heat medium can be pumped through the cell providing with forced filtration of the components from the liquid. As soon as the components collection unit becomes filled with the removed electronic components, the recirculation pump can be stopped, the bottom of the working vessel can be closed and separated from the collection unit, the collection unit can be opened, and the separated electronic components can be removed and sent for further treatment/separation.

The smallest screen of the collection unit can be configured to retain all the smallest components and can be configured to allow only the hot liquid heat medium and the molten solder to pass through it. After passing through the components separation unit, the hot liquid heat medium can be brought back to the working vessel. The molten solder detached from PWBs can accumulate within the volume of the liquid heat medium and can be separated. To achieve this, a portion of the liquid heat medium which passed through the components separation unit can be pumped into a cold filtration unit for solder removal. In certain embodiments, the flow rate for solder removal is lower than the flow rate of recirculation through the components separation unit as solder accumulates in the volume of the working liquid heat medium relatively slowly. The partial flow taken to the solid filtration unit is pumped into this separate reservoir, which can be operated at a relatively cool temperature (e.g., 175° C.), for example, by using a cooler. The solder can be solidified, and the liquid heat medium containing solid solder particles can be pumped through a screen, which retains the solid solder particles and lets the liquid heat medium pass through. The separation screen can be mounted in a removable element, in which the solid solder accumulates and which is removed and liberated from liquid heat medium as needed. The liquid heat medium liberated from the solder, now having a relatively low temperature (e.g., 175° C.), can be pumped back to the working reservoir, in which it is re-heated to the working temperature.

U.S. patent application Ser. No. 13/826,313, filed Mar. 14, 2013, published as U.S. Patent Publication No. US 2014/0217157 on Aug. 7, 2014, and entitled "Removal of Electronic Chips and Other Components from Printed Wire Boards Using Liquid Heat Media," and U.S. Provisional Patent Application Ser. No. 61/761,957, filed Feb. 7, 2013, and entitled "Removal of Electronic Chips and Other Components from Printed Wire Boards Using Liquid Heat Media," are each incorporated herein by reference in their entirety for all purposes. U.S. Provisional Patent Application Ser. No. 62/033,730, filed Aug. 6, 2014, and entitled "Rotational Removal of Electronic Chips and Other Components from Printed Wire Boards Using Liquid Heat Media," is also incorporated herein by reference in its entirety for all purposes.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A process for the removal of electronic components attached to a surface of a printed wire board (PWB) with solder and an underfill, comprising:
   immersing a first rotatable housing containing the PWB in a first liquid heat medium within a first vessel at a temperature higher than the melting temperature of the solder such that the solder is melted, wherein the first rotatable housing is contained within a second rotatable housing, and
   immersing the PWB in a second liquid heat medium within a second vessel at a temperature sufficiently high to remove the underfill.

2. A process according to claim 1, wherein the first rotatable housing comprises a wall having at least one opening through which melted solder is transported out of the first rotatable housing.

3. A process according to claim 2, wherein at least a portion of electronic chips and/or other electronic components removed from the PWB are transported through the at least one opening of the first rotatable housing.

4. The process according to claim 1, wherein the first rotatable housing comprises a wall having a plurality of openings, and the second rotatable housing comprises a wall having a plurality of openings that are smaller than the openings of the first rotatable housing.

5. A process according to claim 1, wherein the electronic components are attached to the surface of the PWB with solder using a surface mount process, a through-hole process, a ball grid array process, and/or a flip-chip process.

6. A process according to claim 1, wherein the solder comprises Sn, Pb, Ag, Cu, Zn, Bi, Sb, Au, Si, and/or In.

7. A process according to claim 1, wherein:
   the first liquid heat medium is at least partially recycled, and
   at least a portion of the molten solder is separated from the first liquid heat medium by cooling the first liquid heat medium containing the molten solder down to a temperature lower than a melting temperature of the solder.

8. A process according to claim 7, wherein at least a portion of the solder solidifies and is at least partially separated from the first liquid heat medium.

9. A process according to claim 8, wherein the solder is at least partially separated from the first liquid heat medium via filtration.

10. A process according to claim 1, wherein the first liquid heat medium has a flash point that is at least about 10° C. higher than a melting temperature of the solder.

11. A process according to claim 1, wherein the first liquid heat medium is a thermal liquid.

12. A process according to claim 1, wherein the first liquid heat medium comprises a synthetic oil, a natural oil, a mineral oil, a petroleum oil, a paraffinic hydrocarbon, a naphthenic hydrocarbon, an aromatic compound, a vegetable oil, an animal oil, a polymeric organosilicon compound, a silicon oil, a hybrid glycol fluid, a natural and/or synthetic wax and/or paraffin, a molten salt, and/or an ionic liquid.

13. A process according to claim 12, wherein the first liquid heat medium comprises the aromatic compound, and the aromatic compound comprises a benzene-based structure, a diphenyl oxide fluid, a biphenyl fluid, a diphenylethane, a dibenzyltoluene, and/or a terphenyl.

14. A process according to claim 1, wherein the first liquid heat medium comprises an additive that improves the resistance of the first liquid heat medium to oxidative breakdown.

15. A process according to claim 1, wherein the PWB is separated into a first material stream comprising recovered solder, a second material stream comprising the recovered bare board, and a third material stream comprising recovered electronic components.

16. A process according to claim 1, wherein precious metals from the PWB are concentrated in a recovered electronic components fraction.

17. A process according to claim 1, wherein the PWB comprises precious metal plating on the surface of the PWB, and the precious metal plating is not substantially affected, damaged, or undercut during the process.

* * * * *